(12) United States Patent
Masterson et al.

(10) Patent No.: US 12,004,307 B2
(45) Date of Patent: Jun. 4, 2024

(54) SHORT OR NEAR SHORT ETCH REWORK

(71) Applicant: International Business Machines Corporation, Armonk, NY (US)

(72) Inventors: Colin Edward Masterson, Rochester, MN (US); John R. Dangler, Rochester, MN (US); Tory Johnson, Rochester, MN (US); Austin Carter, Olmsted, MN (US); Gunnar Mills, Denver, CO (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 17/342,626

(22) Filed: Jun. 9, 2021

(65) Prior Publication Data

US 2022/0400556 A1 Dec. 15, 2022

(51) Int. Cl.
*H05K 3/22* (2006.01)
*H05K 3/06* (2006.01)

(52) U.S. Cl.
CPC .......... *H05K 3/225* (2013.01); *H05K 3/064* (2013.01); *H05K 3/068* (2013.01); *H05K 2203/0126* (2013.01); *H05K 2203/0746* (2013.01); *H05K 2203/0753* (2013.01); *H05K 2203/0766* (2013.01); *H05K 2203/175* (2013.01)

(58) Field of Classification Search
CPC ........ H05K 3/225; H05K 3/064; H05K 3/068; H05K 2203/0746; H05K 2203/0126; H05K 2203/0753
See application file for complete search history.

(56) References Cited

U.S. PATENT DOCUMENTS 5,271,798 A * 12/1993 Sandhu ............... C23F 1/02
257/E23.179
5,641,391 A 6/1997 Hunter et al.
(Continued)

FOREIGN PATENT DOCUMENTS

CN 201896196 U 7/2011
CN 103849873 A 6/2014
(Continued)

OTHER PUBLICATIONS

Geren et al., "Automated rework of printed circuit board assemblies: Methods and procedures," International Journal of Computer Integrated Manufacturing, vol. 9, No. 1, Jan. 1996, 2 pages. [Abstract Only].

(Continued)

*Primary Examiner* — Binh X Tran
(74) *Attorney, Agent, or Firm* — CANTOR COLBURN LLP; Tihon Poltavets

(57) ABSTRACT

Embodiments are directed to short and/or near short etch rework. A microfluidic device is positioned on a portion of a circuit having a defect. The microfluidic device is caused to dispense etchant that removes the defect of the circuit, where a flow of the etchant is controlled to access the portion of the circuit having the defect to thereby etch away the defect, the flow of the etchant being obstructed from accessing other portions of the circuit. The microfluidic device is used to extract the etchant from the portion of the circuit such that the etchant avoids contact with the other portions of the circuit. The microfluidic device is removed from the circuit.

12 Claims, 22 Drawing Sheets

(56) References Cited

U.S. PATENT DOCUMENTS

| | | |
|---|---|---|
| 5,795,493 A | 8/1998 | Bukhman et al. |
| 5,883,437 A | 3/1999 | Maruyama et al. |
| 6,171,737 B1 | 1/2001 | Phan et al. |
| 7,367,118 B2 | 5/2008 | Cheng et al. |
| 7,791,055 B2 | 9/2010 | Williamson et al. |
| 9,366,643 B2 | 6/2016 | Albuschies |
| 10,864,331 B2 | 12/2020 | Flippe et al. |
| 2002/0018172 A1 | 2/2002 | Alwan |
| 2004/0056939 A1* | 3/2004 | Thavarajah ............ H05K 3/061 347/102 |
| 2005/0238506 A1 | 10/2005 | Mescher et al. |
| 2007/0207613 A1* | 9/2007 | Zahorik ............ H01L 21/02074 438/689 |
| 2011/0039362 A1* | 2/2011 | Long .................. H01L 27/1285 257/E21.414 |
| 2013/0075364 A1* | 3/2013 | Wang ..................... G03F 7/265 562/556 |
| 2014/0273499 A1* | 9/2014 | Huang ..................... G03F 7/42 156/345.21 |
| 2016/0003229 A1 | 1/2016 | Mescher et al. |
| 2017/0143829 A1 | 5/2017 | Aslan |

FOREIGN PATENT DOCUMENTS

| | | |
|---|---|---|
| CN | 106658966 A | 12/2016 |
| CN | 107548239 A | 8/2017 |
| CN | 107241864 A | 10/2017 |
| CN | 208701212 U | 4/2019 |
| KR | 102027995 B1 | 10/2019 |
| WO | 2014133792 A1 | 9/2014 |

OTHER PUBLICATIONS

Kelley, "Automating the Rework Process: Technology Advancement Replaces Manual Method," IPC Apex Expo Conference Proceedings, 2013, 5 pages.

* cited by examiner

SHORT OR NEAR SHORT ETCH REWORK

BACKGROUND

The present invention generally relates to computer systems, and more specifically, to computer-implemented methods, computer systems, and computer program products configured and arranged for short and/or near short etch rework.

A printed circuit board (PCB) mechanically supports and electrically connects electrical and electronic components using conductive tracks, pads, and other features etched from one or more sheet layers of copper laminated onto and/or between sheet layers of a non-conductive substrate. Components are generally soldered onto the PCB to both electrically connect and mechanically fasten them to it.

A typical PCB consists of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for electromagnetic shielding or other purposes. The tracks function as wires fixed in place and are insulated from each other by air and the board substrate material. The surface of a PCB may have a coating that protects the copper from corrosion and reduces the chances of solder shorts between traces or undesired electrical contact with stray bare wires. For its function in helping to prevent solder shorts, the coating is called solder resist or solder mask.

SUMMARY

Embodiments of the present invention are directed to computer-implemented methods for short and/or near short etch rework. A non-limiting example computer-implemented method includes positioning a microfluidic device on a portion of a circuit having a defect and causing the microfluidic device to dispense etchant that removes the defect of the circuit, where a flow of the etchant is controlled to access the portion of the circuit having the defect to thereby etch away the defect, the flow of the etchant being obstructed from accessing other portions of the circuit. The method includes extracting using the microfluidic device the etchant from the portion of the circuit such that the etchant avoids contact with the other portions of the circuit and removing the microfluidic device from the circuit.

A non-limiting example computer-implemented method includes positioning a microdispense head of the microfluidic device over a portion of a circuit having a defect and causing the microdispense head of the microfluidic device to dispense etchant on the defect of the circuit in order to etch away the defect, a flow of the etchant being obstructed from accessing other portions of the circuit. The computer-implemented method includes extracting using one or more outlet posts of the microfluidic device the etchant from the portion of the circuit such that the etchant avoids contact with the other portions of the circuit and removing the microfluidic device from the circuit.

A non-limiting example computer-implemented method includes covering an area surrounding at least one defect in a circuit with a resist, causing a microdispense head to dispense etchant on the defect in the circuit in order to etch away the defect, and removing the microdispense head from the circuit.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
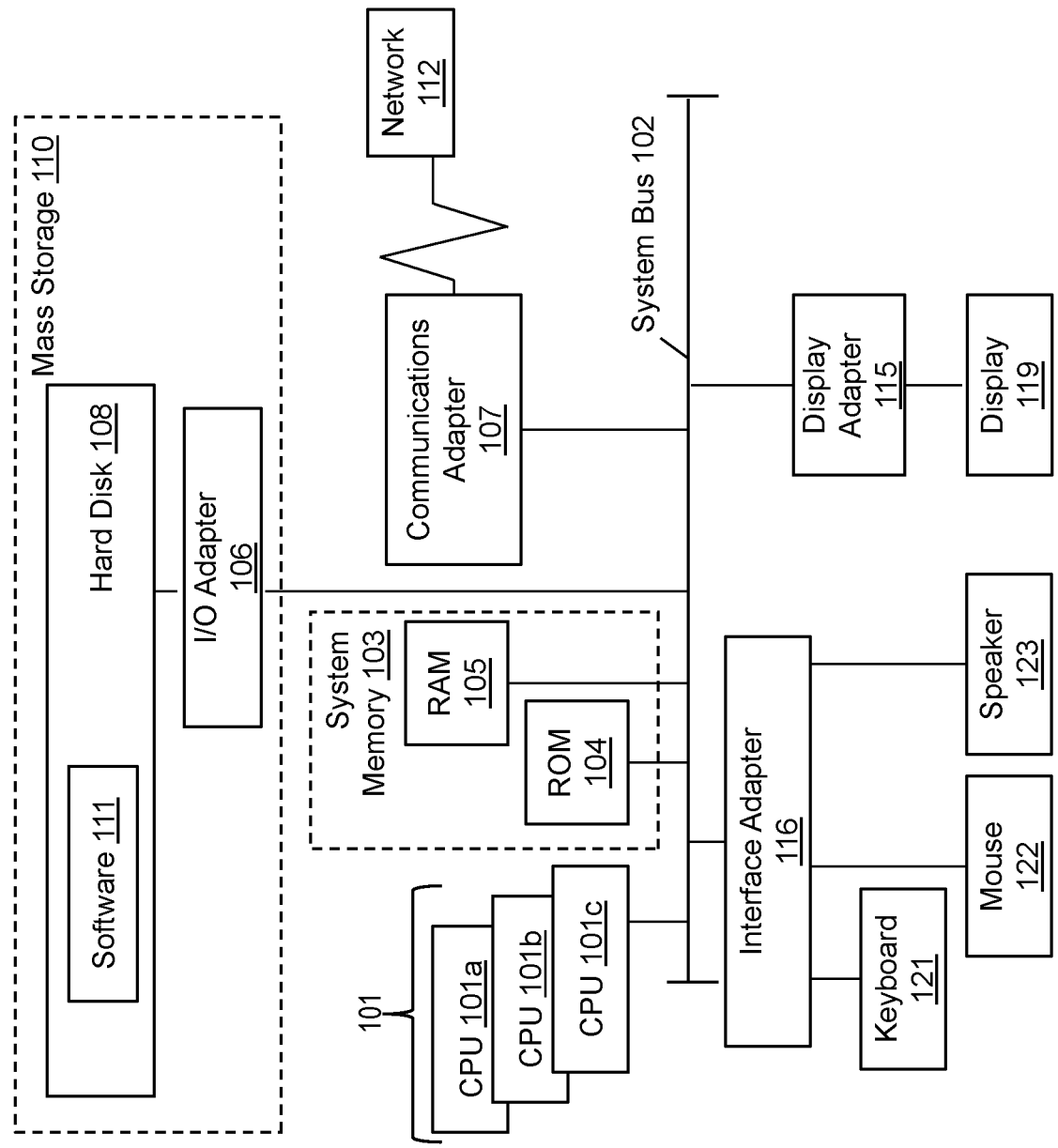
FIG. 1 depicts a block diagram of an example computer system for use in conjunction with one or more embodiments of the present invention.

One or more embodiments of the present invention provide computer-implemented methods, computer systems, and computer program products arranged and configured for short and/or near short etch rework. One or more embodiments provide controlled microfluidic etching using a microfluidic flow device. One or more embodiments can provide for micro-dispensing of etch chemistry using a microdispense head. Particularly, techniques can be used to fix electrical failures such as shorts (i.e., short circuits), as well as non-electrical failures such as partial shorts having copper that should not be present in the circuit. These techniques afford precision etch of defects that violate rules for a circuit.

Printed circuit boards (PCBs) and flexible circuits use similar manufacturing processes but different substrates. A simplified process to make printed circuit boards may include pre-bonding copper to a core and selectively etching away copper in each core (e.g., per Gerber data). The Gerber format is an open ASCII vector format for printed circuit board designs. The process includes applying photosensitive film, which is the resist that cross-links when exposed to ultraviolet light, applying ultraviolet light thereby cross-linking parts of the resist, and washing with an alkaline solution to remove any of the unexposed photoresist. The process includes using etchant (e.g., cupric chloride) to etch away the copper that is not covered by photoresist, striping off exposed photoresist, and performing an inspection procedure which can be an automated optical inspection (AOI), an electrical inspection, etc. Layers are laminated, drilled, and plated. The outer layer is etched and inspected. Typical production issues at inspection include electrical failures and non-electrical failures, for example, quality and specification failures. Electrical failures include shorts which can be full height in which the excess material causing the short is the full height of the layer (i.e., the full height of the copper traces) and partial height in which the excess material is less than the full height of the layer. Electrical failures can also include open circuits. Quality and specification (non-electric) failures can include excess material, which is violation of conductor spacing, either full height or partial height, and insufficient copper.

Various processes can be utilized to identify defects on printed circuit boards as understood by one skilled in the art. By way of example, automated or automatic optical inspection (AOI) can be used which is an automated visual inspection of printed circuit board manufacture where a camera autonomously scans the printed circuit board and compares to design data to identify electric failure and quality defects. Another example is the in-circuit test (ICT) in which an electrical probe tests a populated printed circuit board, checking for shorts, opens, resistance, capacitance, and other basic quantities which will show whether the assembly was correctly fabricated. Additionally, human inspection can also be used to discover defects The process to fix electrical (shorts) and non-electrical failures includes laser ablation and manual/knife removal. Laser ablation uses a laser to melt/ablate excess copper and the equipment for laser ablation can be expensive. With laser ablation, residues and discoloration may result, and the added heat may risk heat sensitive substrates. With manual/knife removal, bridges are cut out manually and this can create tear propagation points. Manual/knife removal risks incomplete removal of all metallurgy. Both methods have the risk of damaging the core and/or the underlying substrate, removing the substrate, and stressing the substrate material.

To address one or more issues discussed herein, one or more embodiments use a microfluidic device/micropump to pump and/or draw etchant down a trace channel in order to etch the target defect. The applied etchant removes the short or short circuit. To remove the defect, one or more methods may use a physical obstruction to block and/or control flow of chemistry from reaching beyond the target region containing the defect. The microfluidic device geometry could be applicable to multiple trace schemes, where traces are the wires on printed circuit board. The methods could apply to traces having different spacings and/or having different copper heights. In one or more embodiments, the microfluidic device geometry and/or design can be tailored to the defect. In tailoring the microfluidic device, the microfluidic device geometry can have a bypass or recess for a full height defect which is a defect having the full height of the copper trace. Further, the microfluidic device geometry can be tailored for the width of the defect. In one or more embodiments, the microfluidic device geometry can be tailored for a clearance ring around a via. Multiple microfluidic devices with different geometries could be utilized to remove a defect, for example, in different stages of etching the defect.

There are many technical benefits and technical solutions provided herein. The methods to remove defects could be deployed independently and/or as an addon to an automated optical inspection (AOI) system and can even be performed while the AOI tool is being used. One or more embodiments can use normal etch chemistry, thereby not subjecting the circuit to anything different. As additional technical benefits, one or more embodiments do not subject the material to additional heat or chemicals or expose the core to physical damage. Further, rework is possible in situations where the laser or knife is too risky or when the user has not invested in a laser. A highly skilled technician is not needed to use one or more embodiments in contrast to using the knife, thereby reducing opportunity for workmanship defects and errors.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 can be, for example, a server, desktop computer, laptop computer, tablet computer, or smartphone. In some examples, computer system 100 can be a cloud computing node. Computer system 100 can be described in the general context of computer system executable instructions, such as program modules, being executed by a computer system. Generally, program modules can include routines, programs, objects, components, logic, data structures, and so on that perform particular tasks or implement particular abstract data types. Computer system 100 can be practiced in distributed cloud computing environments where tasks are performed by remote processing devices that are linked through a communications network. In a distributed cloud computing environment, program modules can be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and can include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 can be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 can be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which can be an outside network, enabling the computer system 100 to communicate with other such systems. In one embodiment, a portion of the system memory 103 and the mass storage 110 collectively store an operating system, which can be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 can be connected to one or more I/O buses that are connected to the system bus 102 via an intermediate bus bridge (not shown). A display 119 (e.g., a screen or a display monitor) is connected to the system bus 102 by the display adapter 115, which can include a graphics controller to improve the performance of graphics intensive applications and a video controller. A keyboard 121, a mouse 122, a speaker 123, etc., can be interconnected to the system bus 102 via the interface adapter 116, which can include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 can be a cellular network, a radio network, a wide area network (WAN), a local area network (LAN), or the Internet, among others. An external computing device can connect to the computer system 100 through the network 112. In some examples, an external computing device can be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 can be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
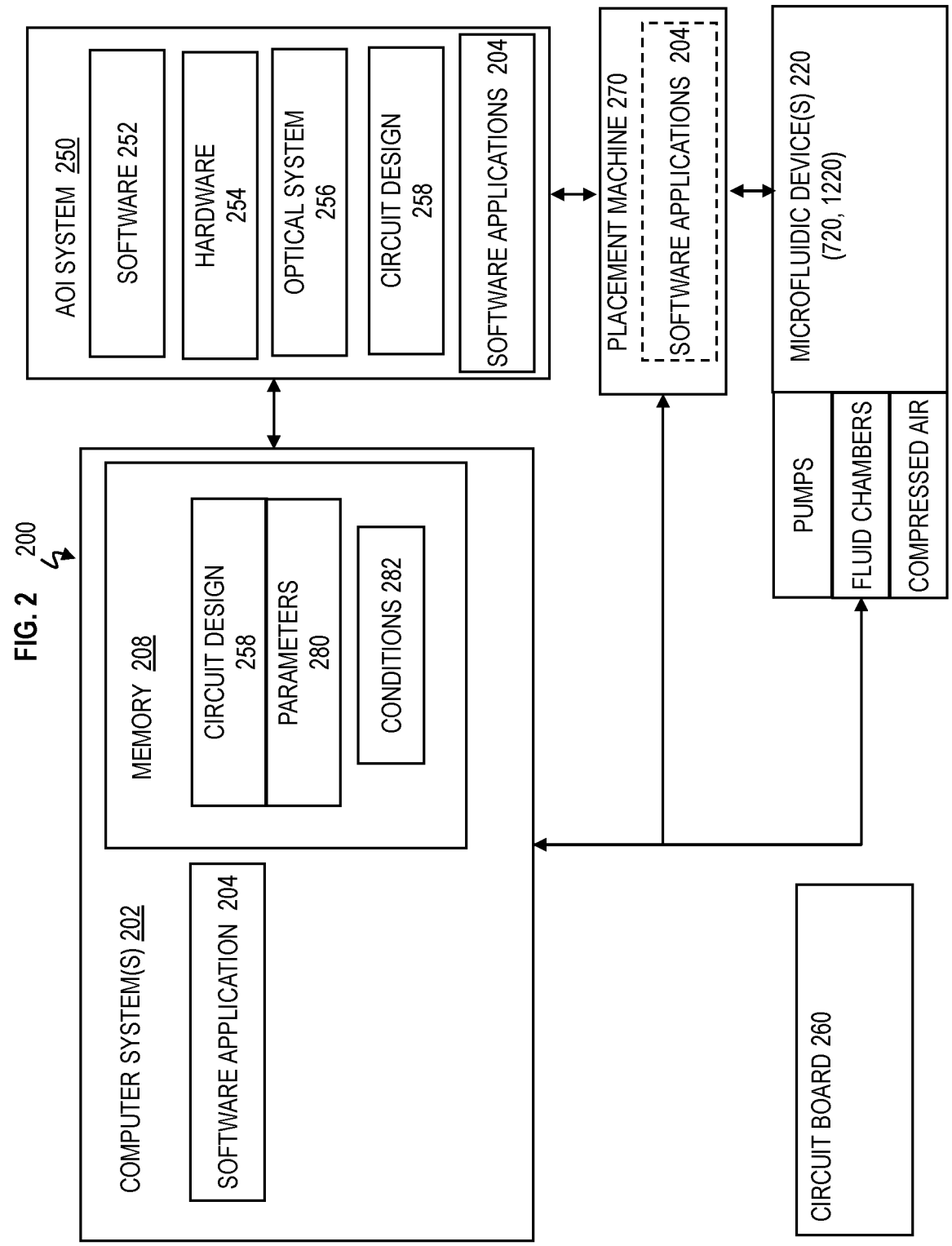
FIG. 2 depicts a block diagram of a system for short and/or near short circuit etch rework in accordance with one or more embodiments of the present invention.

FIG. 2 is a block diagram of a system 200 for printed circuit board (PCB) and/or flexible circuit short and/or near short etch rework in accordance with one or more embodiments of the present invention. System 200 includes one or more computer systems 202 and an automated/automatic optical inspection (AOI) system 250. Computer system 202 and AOI system 250 can include any elements and functions of computer system 100 discussed in FIG. 1.

The AOI system 250 operates, functions, and includes software 252 and hardware 254 in order to perform as understood by one of ordinary skill in the art. Automated optical inspection is an automated visual inspection of printed circuit board manufacture where a camera, for example, in optical system 256, scans the device under test for both catastrophic failure (e.g., missing component) and quality defects (e.g., fillet size or shape or component skew). AOI system 250 can inspect for most types of defects (e.g., component placement, solder shorts, missing solder, etc.) at one place in the line with one single system. In this way, the faulty boards are reworked and the other boards are sent to the next process stage. In addition to optical system 256, AOI system 250 includes a circuit design 258 of a printed circuit board 260 being tested and/or reworked. Circuit design 258 can be stored in any format and may also be stored in memory 208 of computer system 202. Optical system 256 scans and images printed circuit board 260, and software 252 compares the scanned image to the circuit design 258 to determine defects such as near short and/or shorts on printed circuit board 260. It should be appreciated that, although a simplified example of determining defects using AOI system 250 has been discussed, AOI system 250 includes suitable features for operating as an automatic optical inspection system to determine defects on a printed circuit board as understood by one of ordinary skill in the art. Furthermore, defects can be determined and located using any suitable technique known to one of ordinary skill in the art, for use with one or more embodiments.

Upon determining and locating a defect of a near short and/or short circuit on printed circuit board 260, one or more microfluidic devices 220 can be utilized to rework the conductive material causing the near short circuit and/or the short circuit on printed circuit board 260, thereby correcting the near short and/or short circuit. In one or more embodiments, computer system 202 can include one or more software applications 204 configured to cause and/or initiate performance of short and/or near short etch rework on printed circuit boards and flexible circuits using microfluidic device 220, as well as microfluidic device 720 and microfluidic device 1220 discussed in FIGS. 7 and 12, respectively. Computer system 202 can be coupled to and/or integrated in AOI system 250 in order to facilitate rework (i.e., correction) of near short circuit and/or the short circuit. In one or more embodiments, software application 204 may be implemented to run and execute in AOI system 250. Whether implemented in computer system 202, AOI system 250, and a combined system of both computer 202 and AOI system 250, software application 204 can be represented by the software 111 stored as instructions for execution by the processors 101 to cause operations as discussed herein.

Software application 204 can receive identification of the defect in printed circuit board 260 from AOI system 250 and/or another suitable system. For example, software 252 of AOI system 250 can provide the scanned image of the printed circuit board 260 with the location of the defect to software application 204, as well as placement machine 270. The location of the defect can correspond to grid coordinates such as X, Y, Z coordinates on the scanned image which directly corresponds to the location of the defect on circuit board 260. Software 252 may also provide the identification of any other circuit components and traces in the vicinity of the defect in order to register the location of the defect.

In one or more embodiments, software application 204 can cause and/or initiate placement machine 270 to place microfluidic device 220 on printed circuit board 260 at the location of the defect. Software application can cause placement machine 270 to select microfluidic device 220 from a plurality of microfluidic devices of different geometries and operations. Software application 204 can initiate and/or cause the microfluidic device 220 to execute such that the microfluidic device 220 dispenses an etchant to etch away the excess conductive material causing the near short and/or short on printed circuit board 260. In one or more embodiments, software application 204 can cause etchant in one or more fluid chambers (or reservoirs) to be pumped (via one or more pumps) from the fluid chamber to microfluidic device 220. The etchant is dispersed by microfluidic device 220 until the excess conductive material is removed. When complete, software application 204 is configured to cause and/or instruct placement machine 270 to lift up and remove microfluidic device 220 from printed circuit board 260. In one or more embodiments, placement machine 270 may include software application 204. In one or more embodiments, placement machine 270 can be coupled to and instructed by computer system 202 and/or AIO system 250 to function as discussed herein. Placement machine 270 may include the components, both hardware and software components, of known placement machines to operation and function as understood by one skilled in the art. Placement machine 270 can be referred to as a surface mount technology component placement system, commonly called pick-and-place machines or a picker, which are robotic machines that are used to place surface-mount devices (SMDs) onto a printed circuit board. Placement machines are used for high speed, high precision placing of a broad range of electronic components, like capacitors, resistors, integrated circuits onto the printed circuit boards which are in turn used in computers, consumer electronics, etc.

Software application 204 can be implemented as a controller and/or module. Modules can be implemented as instructions stored on a computer-readable storage medium, as hardware modules, as special-purpose hardware (e.g., application specific hardware, application specific integrated circuits (ASICs), as embedded controllers, hardwired circuitry, etc.), and/or as some combination or combinations of these. In examples, modules described herein can be a combination of hardware and programming. The programming can be processor executable instructions stored on a tangible memory, and the hardware can include processing circuitry (e.g., processors 101) for executing those instructions. Thus, a system memory can store program instructions that when executed by processing circuitry implement the modules described herein. Other modules can also be utilized to include other features and functionality described in other examples herein. Alternatively or additionally, modules can include dedicated hardware, such as one or more integrated circuits, application specific integrated circuits (ASICs), application specific special processors (ASSPs), field programmable gate arrays (FPGAs), or any combination of the foregoing examples of dedicated hardware, for performing the techniques described herein.

Figure 3:
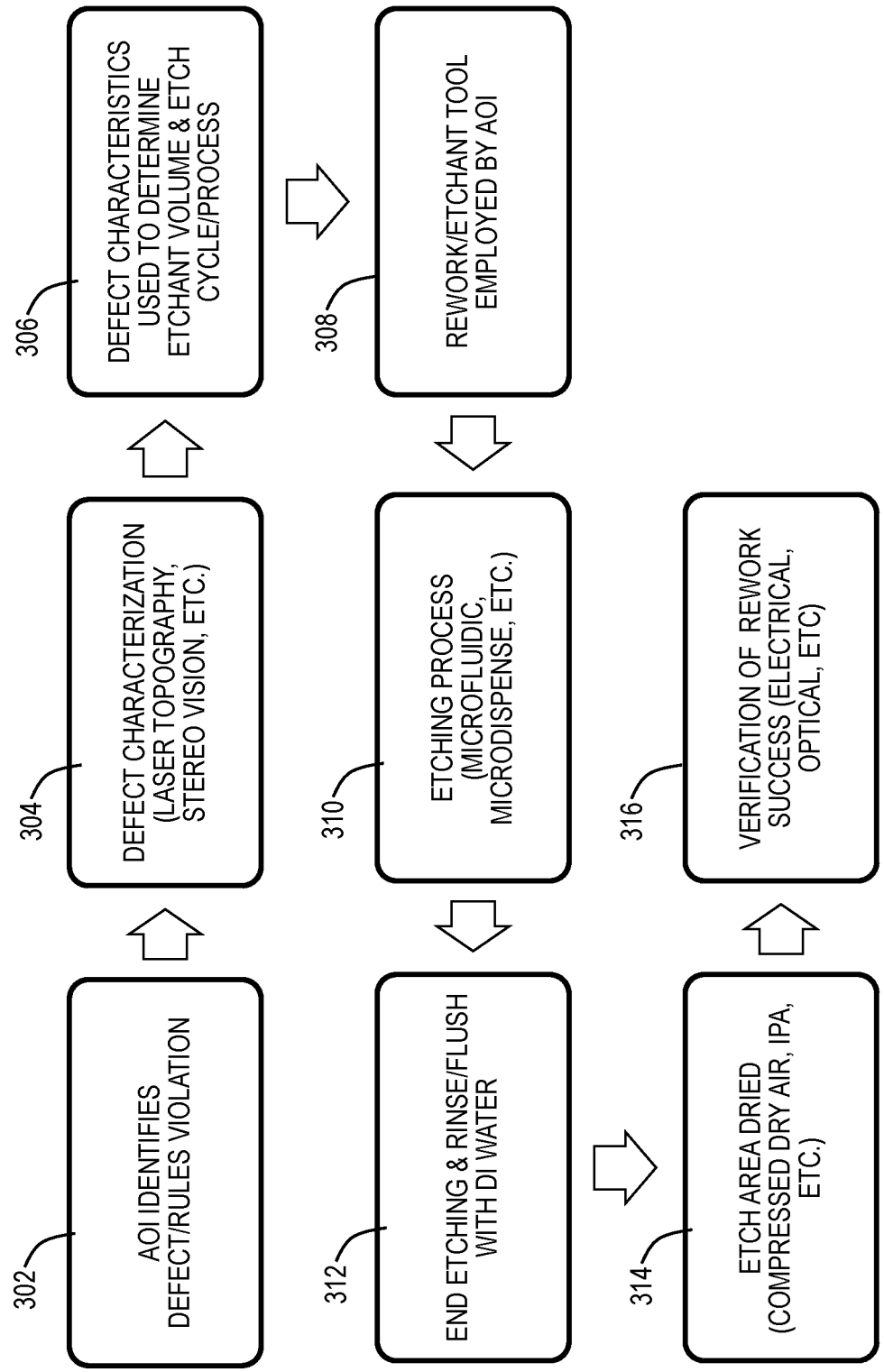
FIG. 3 depicts a flowchart of a computer-implemented process of short and/or near short etch rework for defects on a circuit in accordance with one or more embodiments of the present invention.

FIG. 3 is a flowchart of a computer-implemented method 300 of short and/or near short etch rework for defects on a printed circuit board in accordance with one or more embodiments. Computer-implemented method 300 can be executed by system 200. At block 302, AOI system 250 is configured to identify a defect and/or rules violation by the circuit on printed circuit board 260. By way of example, AOI system 250 may optically scan and/or capture images of the circuit on printed circuit board 260. AOI system 250 compares the captured images of the circuit on printed circuit board 260 with circuit design 258 of the circuit to determine if any design rules have been violated. It is assumed that one or more defects in the circuit are determined.

At block 304, AOI system 250 is configured to perform defect characterization of the defect identified on printed circuit board 260. Defect characterization can be performed using laser topography, stereo vision, etc.

At block 306, AOI system 250 and/or software application 204 is configured to receive the defect characterization information of the defect and then use the defect characteristics to determine etchant volume and etch cycle/process. The volume of etchant could be conservatively estimated by the volume and/or thickness of the defect. The volume of the etchant increases according to the volume and/or thickness of the defect. During use, the feedback could be used to determine if adjustments to the etchant amount are required. Iterating on this etch and feedback allows the rework software controlling the microfluidic/microdispense device to adapt to different types of defects. The control software (e.g., software application 204) has control over the device's fluid flow, temperature, and other operation parameters. AOI system 250 and/or software application 204 can use parameters 280 of components for the circuit design 258 to determine an amount of etchant that is to be applied to remove (i.e., rework) the defect based on the defect characterization information (i.e., characteristics). For example, the defect characterization information may indicate the length and height of the excess conductive material causing the short circuit and/or near short circuit. Also, defect characterization information may indicate whether the excess conductive material is a full height defect or partial height defect. A full height defect refers to the excess conductive material being the same or nearly the same height of copper traces in the circuit on printed circuit board 260. A partial height defect refers to the excess conductive material being less that the full height of coper traces of the circuit on printed circuit board 260. Software application 204 may access a table of conditions 282 in which the table of conditions 282 includes instructions on the volume of etchant to be applied by microfluidic device 220 to remove each type of short, for example, a full height defect and partial height defect, as well as the best type of microfluidic device to select for the type of defect. Table of conditions 282 may also instruct on the type of cycle/process to be applied using microfluidic device 220. Example conditions may include, but are not limited to, volume of copper, consisting of height, width, and length, number of nets affected by the defect, geometry of the defect and the corresponding available microfluidic/microdispense nozzles that would determine droplet size. Other conditions include cupric chloride etchant ratio and temperature of solvent and environmental temperature.

At optional block 308, AOI system 250 may employ software application 204 as a rework/etchant tool. In one or more embodiments, software application 204 may have already been called by AOI system 250 and/or initiated in response to the determination of a defect.

Figure 4:
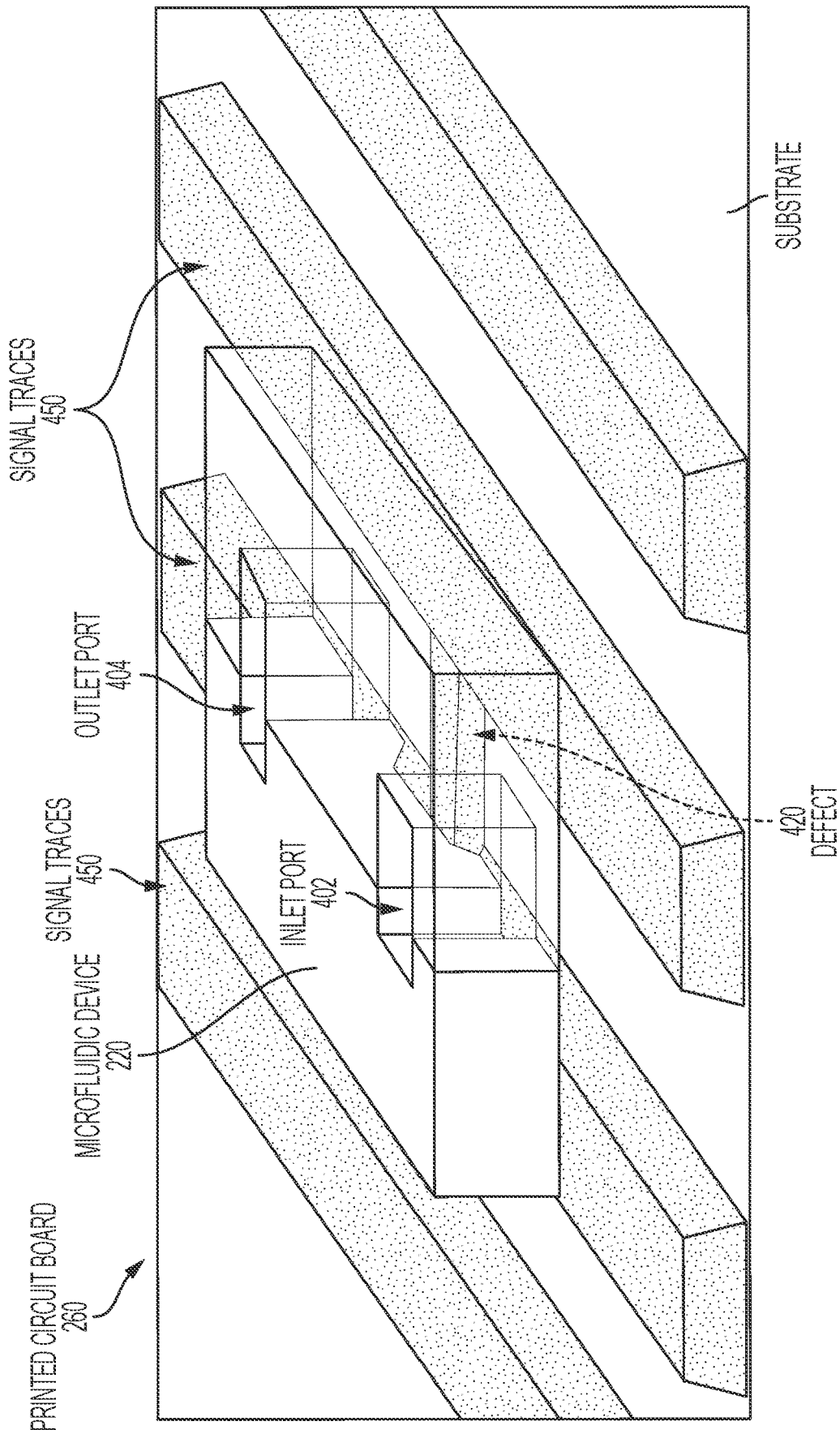
FIG. 4 depicts a block diagram illustrating a microfluidic flow device positioned at the location of defect in a circuit in accordance with one or more embodiments of the present invention.

At block 310, software application 204 initiates and/or instructs microfluidic device 220 to perform the etching process to remove the defect on printed circuit board 260. In one or more embodiments, software application 204 may instruct placement machine 270 to select desired microfluidic device 220 and place the selected microfluidic device 220 at the location of the defect on printed circuit board 260. One or more embodiments may use AOI system 250 and/or computer numerical control (CNC) technology as is used in pick and place to locate the defect. FIG. 4 is a block diagram illustrating microfluidic device 220 placed at the location of defect 420 in the circuit on printed circuit board 260. FIG. 4 depicts a transparent cutaway view for clarity in which half of the microfluidic device 220 is transparent. A defect 420 is shown between two signal traces 450. The signal traces 450 can be copper material that connects to other parts of the circuit as designed, while defect 420 is excess copper material that has landed or been deposited on printed circuit board 260 at a location in violation of the circuit design and/or design rules. In FIG. 4, the excess conductive material is in direct contact with two (copper) signal traces 450. Defect 420 is a short or short circuit between the two (copper) signal traces 450. As seen in FIG. 4, microfluidic device 220 is positioned such that an inlet port 402 is placed on one side of the defect 420 and an outlet port 404 is placed on the opposite of the defect 420. Alignment fins/posts (fins/posts may or may not be attached to the device) are not illustrated in FIG. 4 for the sake of clarity but are illustrated in other figures. In subsequent views, the transparent half of microfluidic device 220 will be removed for the sake of clarity.

Figure 5:
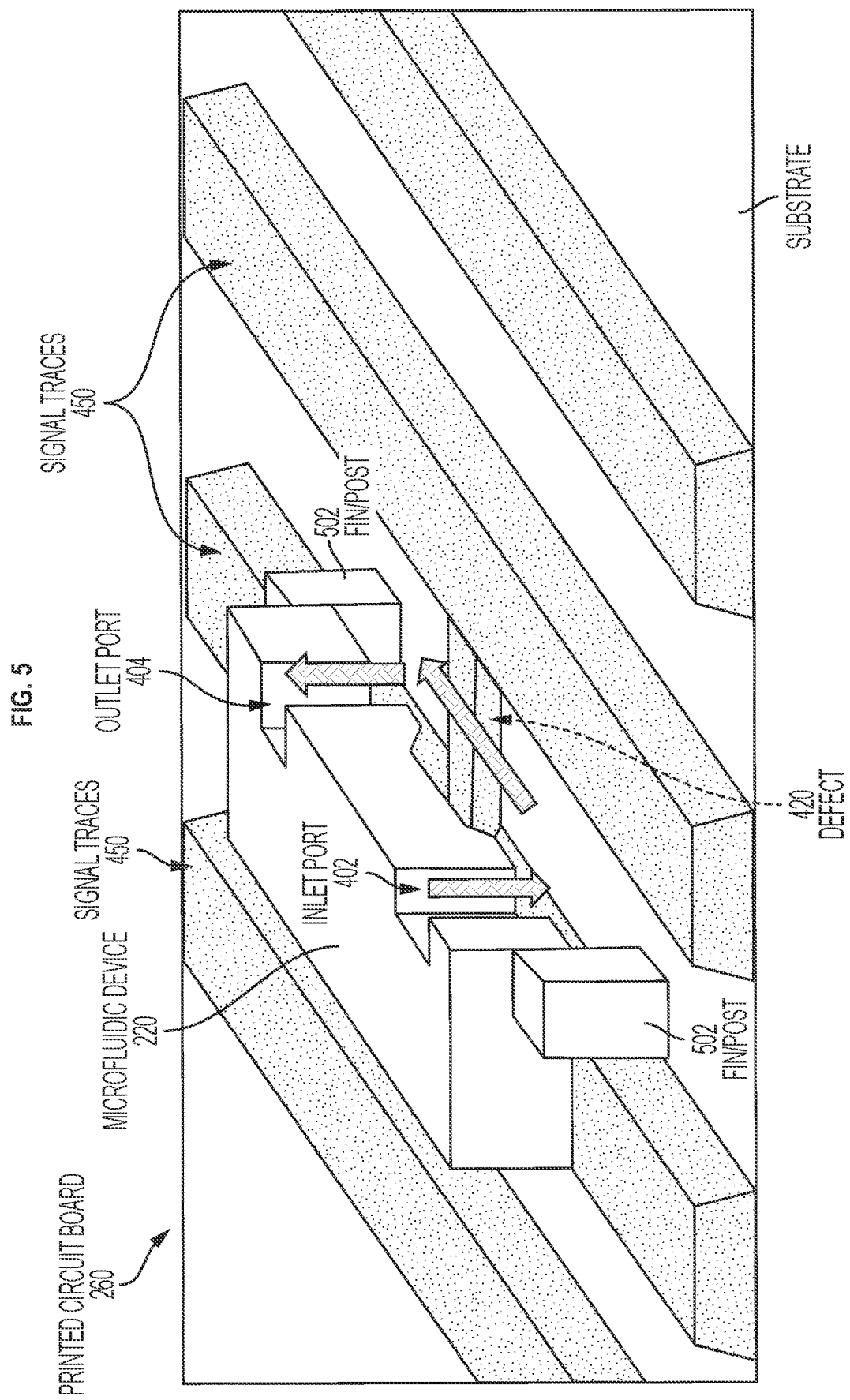
FIG. 5 depicts a block diagram illustrating a cutaway view of a microfluidic flow device positioned on a circuit in accordance with one or more embodiments of the present invention.
Figure 6:
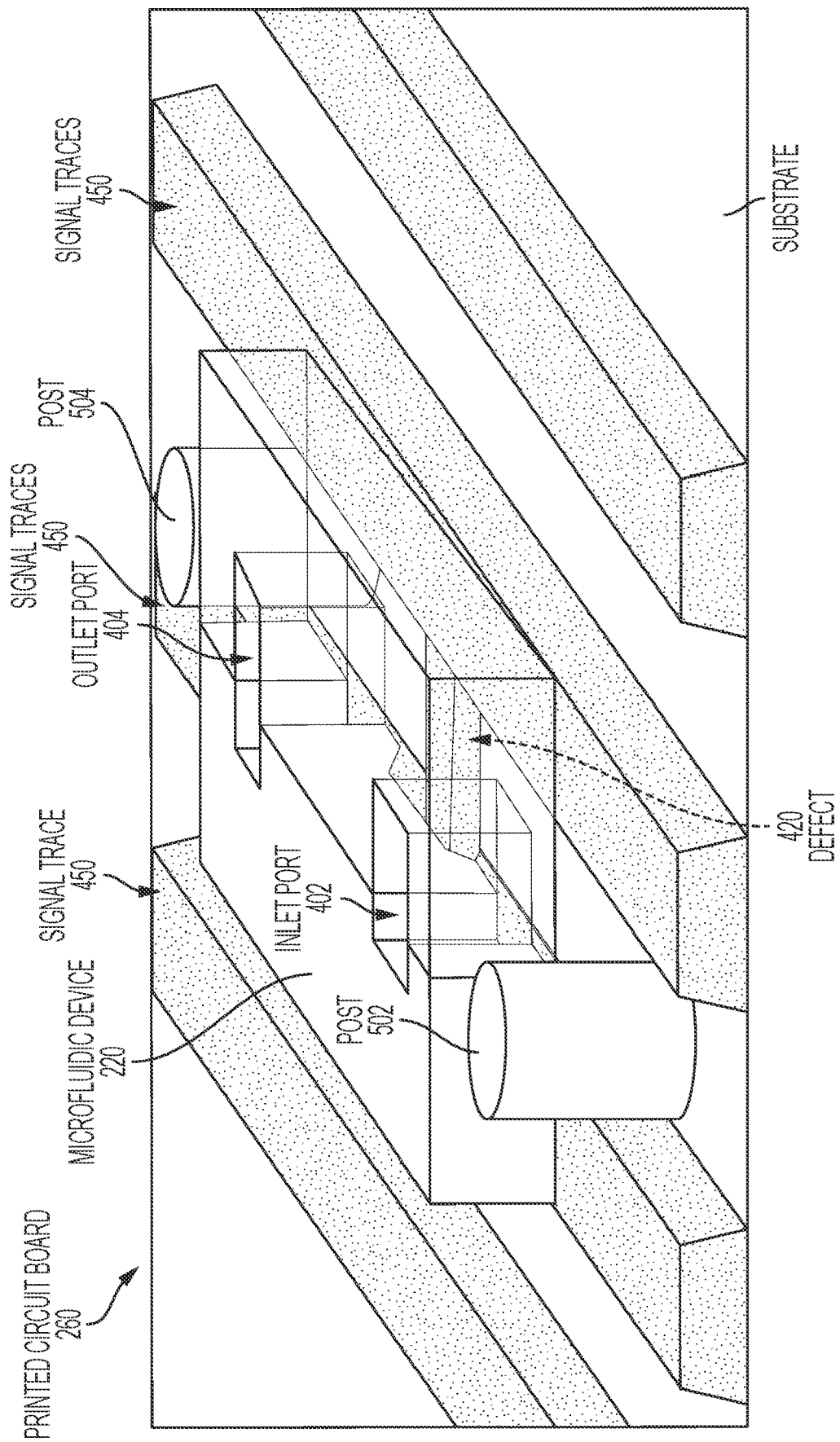
FIG. 6 depicts a block diagram a microfluidic device with posts to obstruct/block a channel in accordance with one or more embodiments of the present invention.

Software application 204 can instruct microfluidic device 220 to dispense etchant to remove the defect, which is a short and/or near short circuit caused by excess conductive material. One or more fluid chambers (or reservoirs) filled with etchant can be coupled to inlet port 402 and another fluid chamber can be coupled to outlet port 404. Software application 204 can control one or more pumps to cause the fluid chamber coupled to inlet port 402 to disperse etchant. Another matched pump may be coupled to outlet port 404 and controlled by software application 204 to create a vacuum to extract etchant. FIG. 5 is a block diagram depicting a cutaway view of the microfluidic device 220 positioned on the circuit of printed circuit board 260 according to one or more embodiments. Half of the microfluidic device 220 is removed to show the flow of etchant. Alignment fins/posts 502 and 504 are utilized to help register the microfluidic device 220 to the signal traces 450, and likewise, half of the fins/posts 502 and 504 are depicted in FIG. 5. Fins/posts 502 and 504 can have various geometries including circular, rectangular, hexagonal, etc. Although rectangular geometries are illustrated in FIG. 5 and circular geometries are illustrated in FIG. 6, it should be appreciated that fins/posts 502 and 504 are not meant to be limited and can include any suitable shape. In FIG. 5, fins/posts 502 and 504 are attached to the body of microfluidic device 220. Fins/posts 502 and 504 help control the flow of etchant. Common etchants may include cupric chloride or ammoniacal etchants, but are to be compatible with the microdispense/microfluidic nozzle materials. In addition to helping align the microfluidic device 220 to the signal traces 450, fins/posts 502 and 504 contain and/or control the flow of the etchant between the two fins/posts 502 and 504 within the space of the two signal traces 450. Etchant flows in though the inlet port 402, through the channel which is the space between the two signal traces 450 connected by defect 402 and blocked by the two fin/post 502 and 504, over defect 402, and back into outlet port 404 of microfluidic device 220. This controlled flow of etchant continues and etches away defect 420.

At block 312, software application 204 instructs the microfluidic device 220 to end etching and perform rinse/flushing. The rinse/flushing can be performed using, for example, deionizing water. For example, instead of etchant flowing in through inlet port 402 and out through outlet port 404 in FIG. 5, the rinse/flushing solution is flowed through the microfluid device 220, thereby removing any debris (e.g., pieces of copper material) of the defect that may have remained after etching. One or more fluid chambers coupled to inlet port 402 can contain the rinse solution, software application 204 may control a value or switch (and a pump) that allows the rinse solution to be pumped via a pump into inlet port 402. In one or more embodiments, microfluidic device 220 can be removed, and rinsing/flushing of the etched area of the circuit on printed circuit board 260 is performed using any suitable method. In one or more embodiments, microfluidic device 220 remains, and the rinsing/flushing solution can be applied through inlet port 402 and exit through outlet port 404 similar to the etchant.

At block 314, software application 204 causes the etched area of the circuit to be dried. The previously etched area can be dried using compressed dry air, isopropyl alcohol (IPA), etc. In one or more embodiments, microfluidic device 220 can be removed when applying the comprised dry air, IPA, etc. In one or more embodiments, microfluidic device 220 remains, and the comprised dry air, IPA, etc., can be applied through inlet port 402 and exit through outlet port 404. In one or more embodiments, software application 204 can control a value or switch that couples compressed dry air, IPA, etc., and causes the same to flow through inlet port 402 and exit through outlet port 404.

At block 316, software application 204 can cause verification of rework success. Verification of rework success can be performed by electrical inspection, optical inspection, etc.

FIG. 6 is a block diagram depicting microfluidic device 220 with posts to obstruct/block the channel according to one or more embodiments. Microfluidic device 220 is placed at the location of defect 420 in the circuit on printed circuit board 260. FIG. 6 depicts a transparent cutaway view for clarity in which half of the microfluidic device 220 is transparent. In FIG. 6, fins/posts 502 and 504 are circular and help control the flow. In one or more embodiments, fins/posts 502 and 504 may be attached to the body of microfluidic device 220. In one or more embodiments, fins/posts 502 and 504 may be separate from and not attached to the body of microfluidic device 220. When detached, fins/posts 502 and 504 can be placed using placement machine 270.

Figure 8:
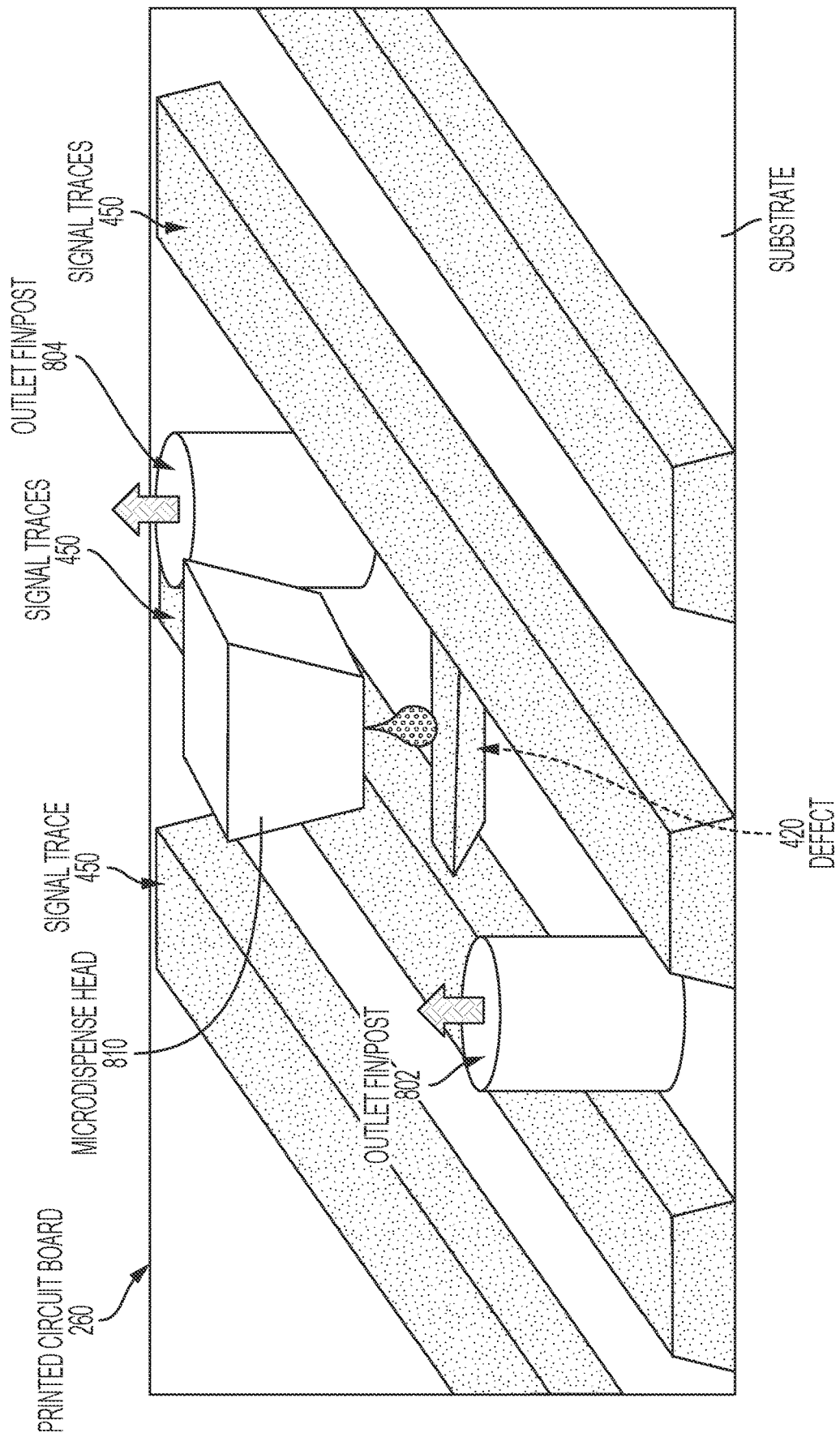
FIG. 8 depicts a block diagram of a microfluidic device having a microdispense head in accordance with one or more embodiments of the present invention.

Fins/posts 502 and 504 and fins/post 802 and 804 in FIG. 8 can be made of a compliant material that has some flexibility for elastic body deformation. Example materials of fins/posts 502 and 504 (including fins/post 402 and 404 and fins/post 802 and 804) can include plastics, rubber, teflon, etc., and combinations thereof. In one or more embodiments, fins/posts 502 and 504 (including fins/post 402 and 404 and fins/post 802 and 804) can have a first inner material that is surrounded and/or partially surrounded by a second outer material. The second inner material may be more flexible or conformable than the first inner material. For example, the first inner material can be plastic while the second outer material can be rubber.

Figure 7:
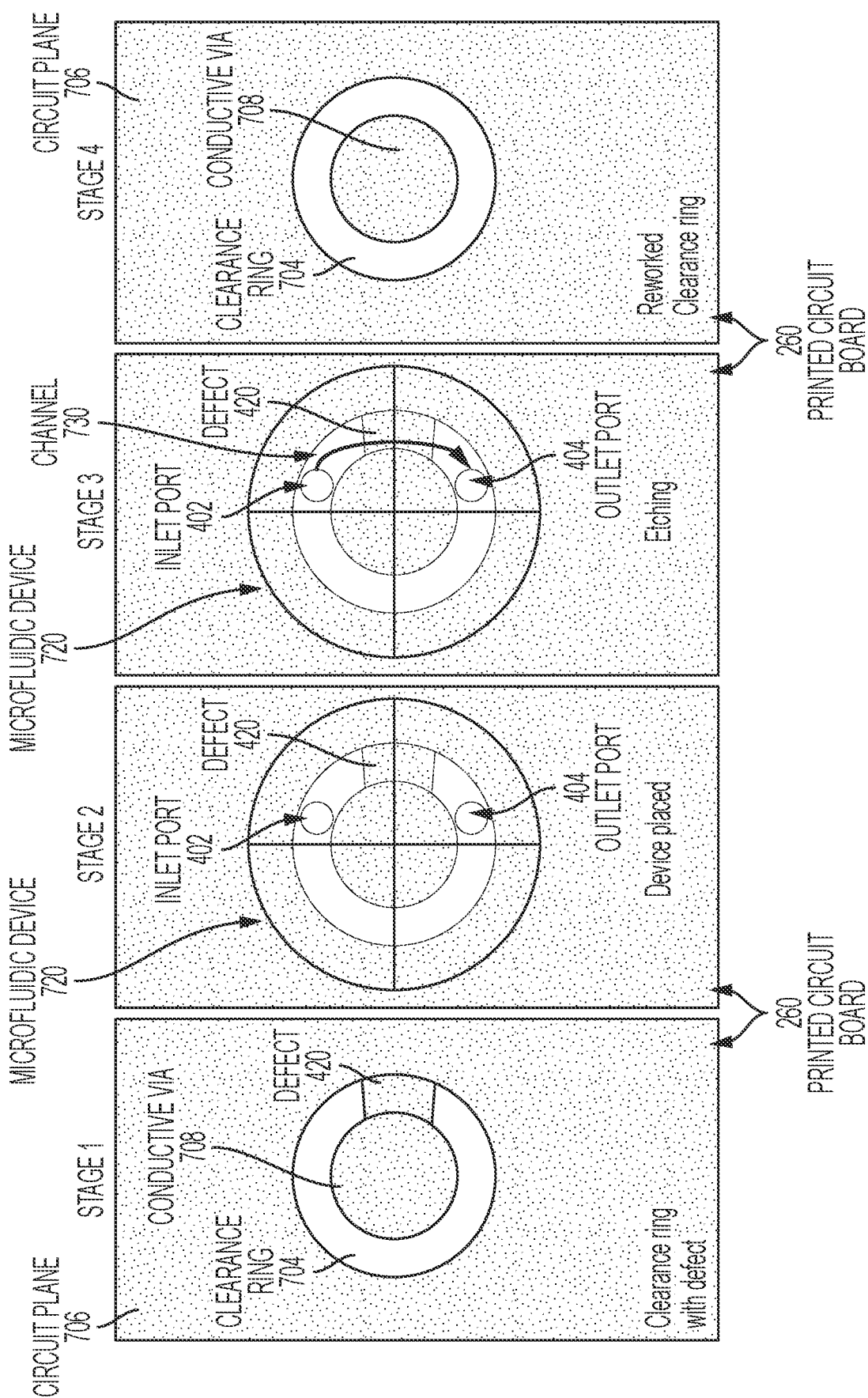
FIG. 7 depicts a block diagram of rework for a circular clearance ring using a mircrofluidic flow device in accordance with one or more embodiments of the present invention.

FIG. 7 is a block diagram depicting circular clearance ring rework according to one or more embodiments. In this example, microfluidic device 720 is designed to remove a defect 420 located at a circular clearance ring 704. Normally, a circle clearance ring should be free of conductive material and separate outer conductive material from inner conductive material. In FIG. 7, stage 1 of rework illustrates that the circuit of printed circuit board 260 has a defect 420 which is excess conductive material in clearance ring 704. The conductive material of the defect electrically connects circuit plane 706 to conductive via 708. The defect 420, circuit plane 706, and conductive via 708 may include the same conductive material such as copper or one or more of the conductive materials may be different (e.g., some copper, aluminum, solder material, etc.). In FIG. 7, stage 2 shows that microfluidic device 720 has been placed at the location of defect 420. Stage 2 illustrates a transparent top-view of a circular microfluidic device 720, where alignment fins/posts are not illustrated for the sake of clarity. However, the alignment fins/post would be positioned behind inlet port 402 and outlet port 404 so at to be out of channel 730 and not obstruct flow of the etchant. In one or more embodiments, microfluidic device 720 could be rectangular shape. Stage 3 represents the etchant flowing in through inlet port 402, through channel 730 such that etchant flows over defect 420 within the clearance ring 704, and back out through outlet port 404. The fluid of the etchant flows in the channel 730 only around one half of the clearance ring 704 because a vacuum (via one or more pumps) is used at outlet port 404 to control the flow of the etchant and because the fins/posts (not shown) block the etchant from flowing around the back half of clearance ring 704. The back half of clearance ring 704 does not contain the defect. Stage 4 illustrates the reworked clearance ring 704 without the defect, and microfluidic device 720 has been removed. The clearance ring 704 exposes the substrate or another material of printed circuit board 260. The substrate may include FR-4 material. FR-4 (or FR4) is a NEMA grade designation for glass-reinforced epoxy laminate material, where "FR" stands for flame retardant. FR-4 is a composite material composed of woven fiberglass cloth with an epoxy resin binder that is flame resistant (self-extinguishing). As discussed herein, fluid chambers and pumps are coupled to microfluidic device 720 and controlled by software application 204 to operate noted herein.

Figure 12:
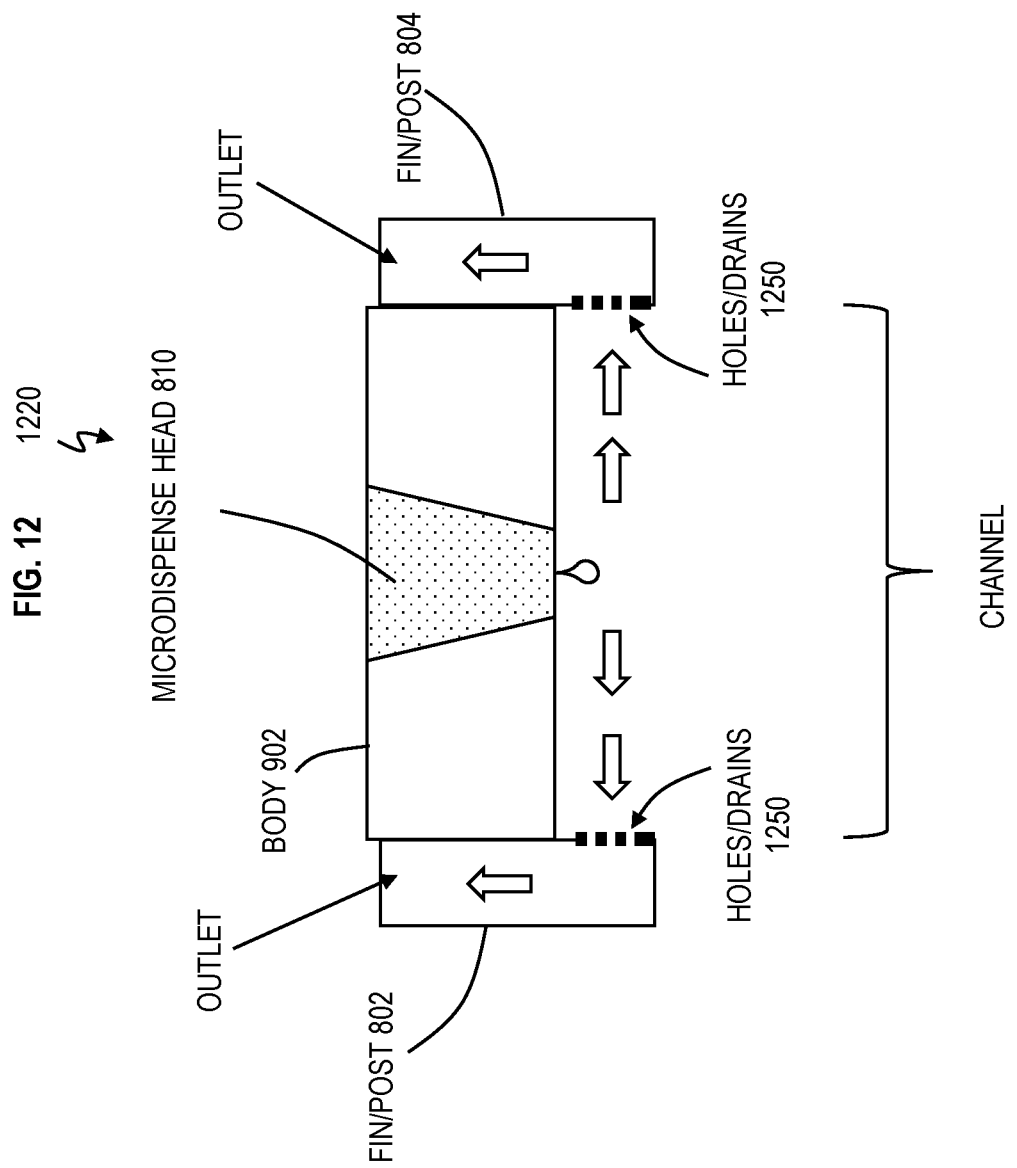
FIG. 12 depicts a block diagram of a microfluidic device in accordance with one or more embodiments of the present invention.

FIG. 8 is a block diagram depicting a microfluidic device (e.g., depicted as microfluidic device 1220 in FIG. 12) having a microdispense head 810 according to one or more embodiments. The microfluidic device can be placed at the location of defect 420. Along with microdispense head 810, the microfluidic device includes alignment outlet fins/posts 802 and 804 which additionally serve as outlet ports and contain the flow of etchant so as not to flow beyond outlet fins/posts 802 and 804. As seen in FIG. 8, microdispense head 810 dispenses droplets of etchant (directly and/or nearly directly) on defect 420. Excess etchant is vacuumed or removed through one or more holes in fins/posts 802 and 804. Example holes/drains 1250 are illustrated in FIG. 12. The holes can be facing the defect 420, thereby facing the channel in which fluid is contained. Microdispense head 810 is similar to an ink jet head of an ink jet printer but dispenses droplets of etch. The etchant is dispensed on top of defect 420. Accordingly, microdispense etch provides a high surface area to fluid volume ratio for the microdispensed droplets. Microdispense etch can be particularly used for applications where there is a low height defect. In one or more embodiments, each droplet can be approximately 1.5-2.0 mils in diameter. A circular mil is a unit of area, equal to the area of a circle with a diameter of one thousandth of an inch (i.e., one mil).

There can be various ways of implementing microdispense head 810. Microdispense head 810 can be implemented as thermal dispensers, which may dispense 50-80 picolitre droplets with a 50-60 micrometer/micron (μm) diameter (~2.0-2.4 mils). Microdispense head 810 can be implemented as piezoelectric dispensers, which may dispense 2 picolitre-5 nanoliter droplets with a 15-200 μm diameter (~0.5-8 mils).

Further, signal traces 450 can have a height of about 0.7 mils and a line width of about 4 mils. The spacing between two signal traces 450 can be about 4 mils. In some cases, the height of signal traces 450 could have a range of 0.1 mil to 2.8 mils (0.0001-0.0028 inches). The line width and spacing between two signal traces could be 1 mil to 500 mils (0.001-0.5 inches), although 1 mil to 20 mils is most common. Microfluidic device discussed herein are designed and dimensioned to accommodate such dimensions, along with a range of dimensions suitable for signal traces and spacing on a printed circuit board.

Figure 9:
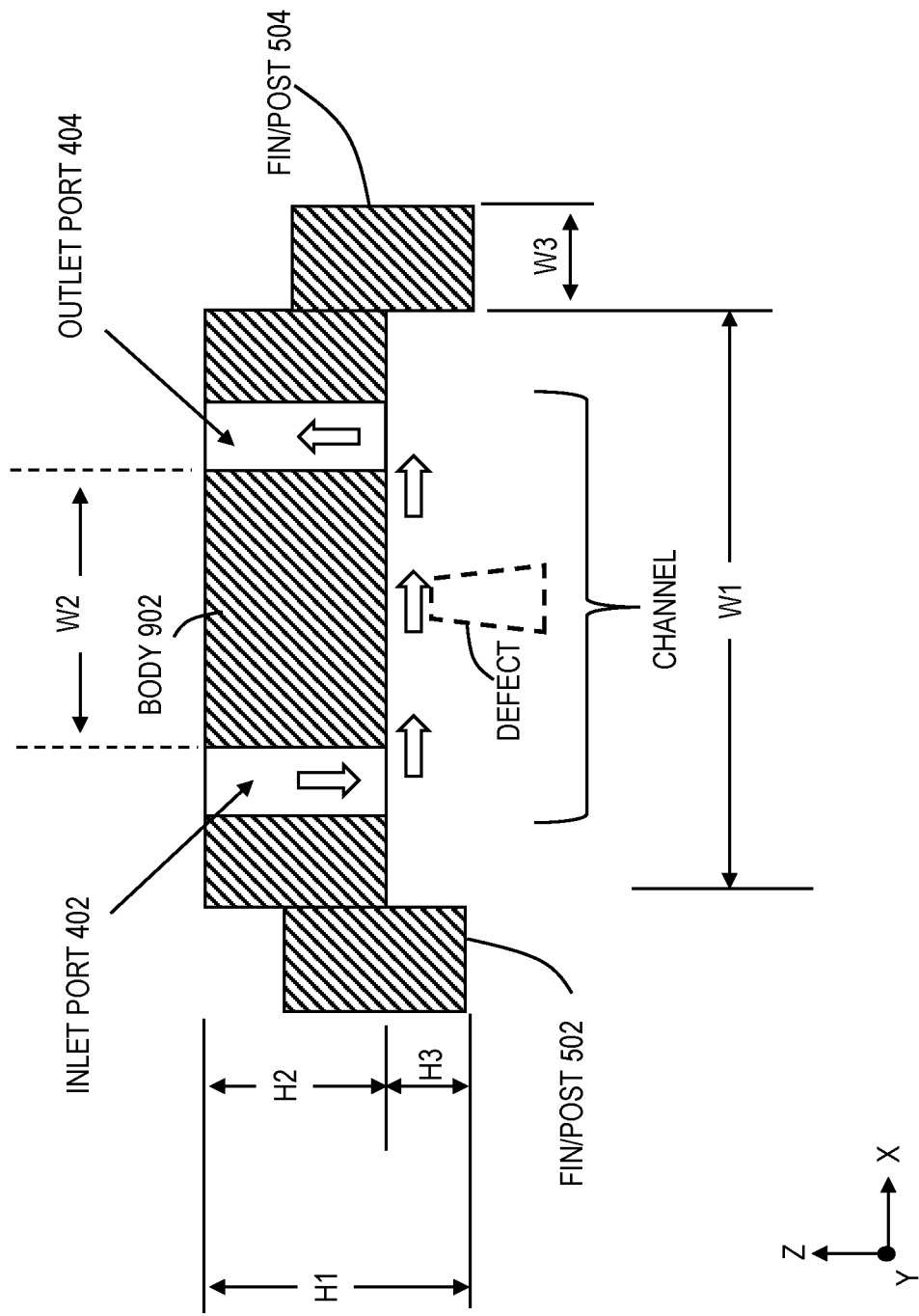
FIG. 9 depicts a cross-sectional view of an example microfluidic device in accordance with one or more embodiments of the present invention.

FIG. 9 is a cross-sectional view of an example microfluidic device 220 according to one or more embodiments. Microfluidic device 220 has a body 902. The body 902 may have a rectangular shape or a circular shape in other embodiments. Example materials of the body 902 may include plastics, titanium, steel, and/or similar materials, or a mix of these. Inlet port 402 and outlet port 404 are formed through the body 902 of microfluidic device 220 so as to flow the fluid of the etchant, air, etc., in the channel. The channel is from the inlet port 402 to outlet port 404, and the defect (not shown) is positioned in the channel to be etched by the etchant. The channel is usually in the space between two adjacent signal traces 450. Fin/post 502 and fin/post 504 are on opposite sides of the channel in order to block the flow of etchant from reaching other parts of the circuit, thereby controlling etchant flow. Moreover, fin/post 502 and fin/post 504 are designed to be positioned on opposite sides of the defect.

The body 902 of microfluidic device 220 can have a width W1. The width Typically, W1 ranges from about 0.25-0.5 inches. The distance between inlet port 402 and outlet port 404 can have a width W2. Typically, the width W2 can range from about 0.004-0.2 inches. The fins/posts 502, 504 can have a diameter and/or width W3. If fins/posts are square or round, W3 would equal the "length" of the fins/posts which would be equal to (and/or nearly equal to) the spacing between signal traces. Accordingly, W3 could match the spacing which might be, for example, 0.002-0.2 inches. In one or more embodiments, W3 may be for a rectangular dimension for fins/posts 502, 504, and W3 does not have to match the spacing between the traces. The total height of microfluidic device 220 from the top of the body 902 to the bottom of fins/posts 502, 504 is about a height H1. The height H1 can range from about 0.1001-1.0028 inches. The body 902 can have a height H2 of about 0.1-1 inch. As discussed herein, the bottom surface of the body 902 sits on the signal trace (i.e., the copper trace) while fins/posts 502, 504 are positioned in the space between two signal traces. Fins/posts 502, 504 extend a distance or height H3 below the bottom surface of the body 902. The height H3 can range from about 0.0001-0.0028 inches (0.1 mils-2.8 mils), which accommodates the thickness of the signal traces. Example dimensions are provided but it should be appreciated that dimensions of microfluidic device 220 are designed and constructed to match or nearly match the circuit of printed circuit board 260. The microfluidic device could be made via a combination of plastic molding, machining, casting, and 3D printing. Microfluidic devices discussed herein can be formed using standard practices and machinery. In one or more embodiments, numerical control (also computer numerical control, and commonly called CNC) is the automated control of machining tools such as drills, lathes, mills and 3D printers by means of a computer. A CNC machine processes a piece of material metal, plastic, wood, ceramic, and/or composite to meet specifications by following a coded programmed instruction and without a manual operator directly controlling the machining operation. Further, microfluidic devices can be formed using any suitable methods.

Figure 10:
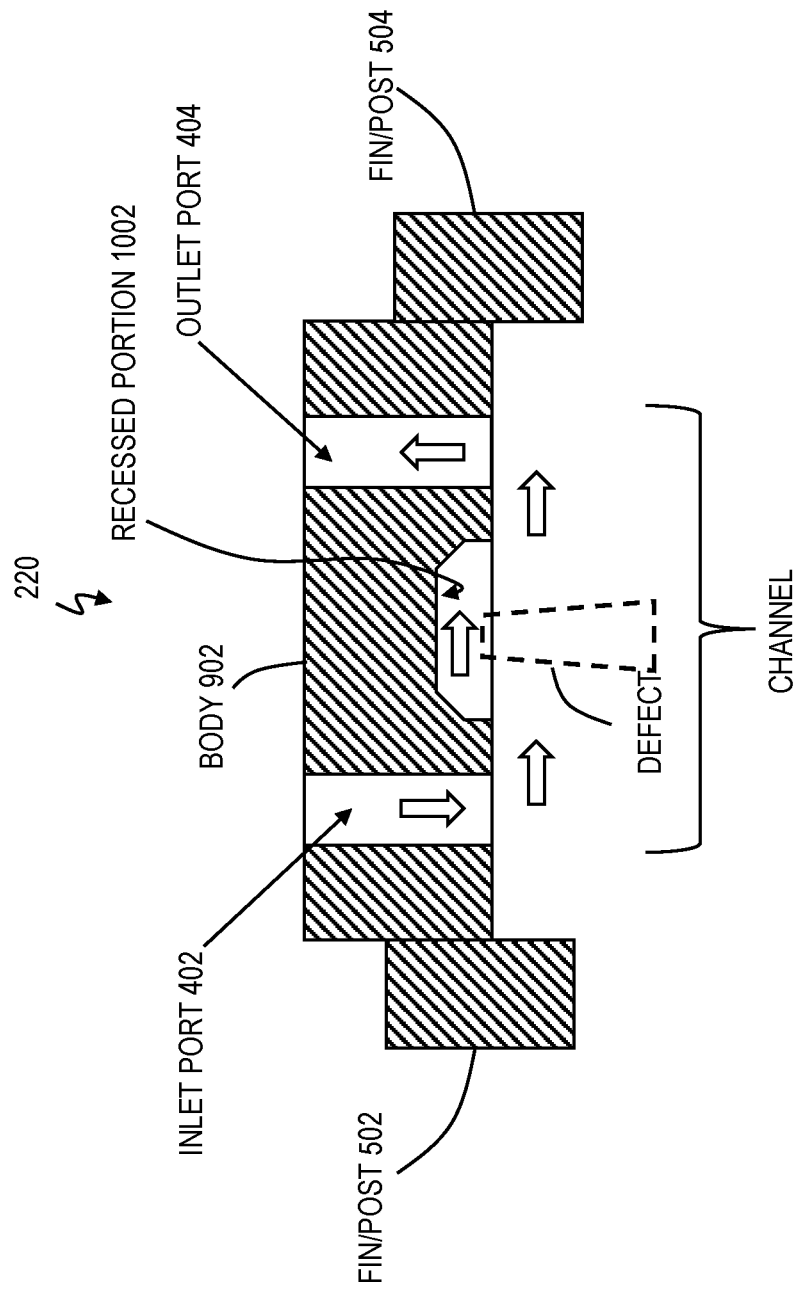
FIG. 10 depicts a cross-sectional view of an example microfluidic device having a recessed portion in accordance with one or more embodiments of the present invention.

FIG. 10 is a cross-sectional view of an example microfluidic device 220 according to one or more embodiments. Microfluidic device 220 can have various device shapes/geometries which may be tailored to different types of defects. In one or more embodiments, software application 204 (and/or placement machine 270) can choose a particular type and/or shape/geometry of microfluidic device 220 to meet or match the characteristics of the defect. In FIG. 10, the body 902 has a bottom recessed portion 1002. The recessed portion 1002 is a bypass to allow the flow of etchant over the full height defect that may possibly impede flow. Because of the constriction caused by the small size of the recessed portion 1002, the flow of etchant is accelerated over the defect thereby increasing the etchant rate of the defect. After a predetermined time and/or once the height of the defect is reduced, software application 204 and/or placement machine 270 can select another microfluidic device 220 that does not have the recessed portion 1002 as shown in FIG. 9, and microfluidic device 220 without the recessed portion 1002 can complete the etch. In one or more embodiments, software application 204 and/or placement machine 270 may not select a different microfluidic device 220 and continues etching the defect with the initial microfluidic device 220 having the recessed portion 1002.

Figure 11:
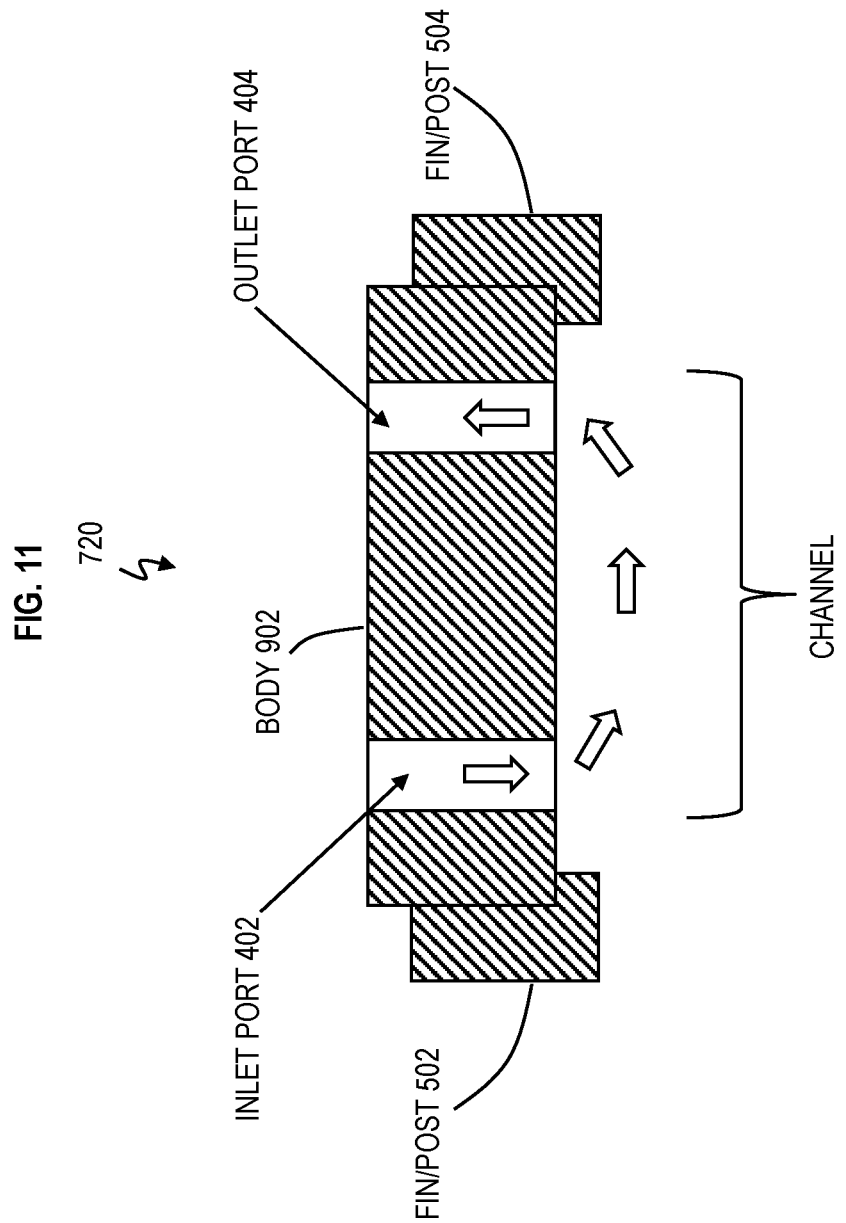
FIG. 11 depicts a cross-sectional view of an example microfluidic device in accordance with one or more embodiments of the present invention.

FIG. 11 is a cross-sectional view of an example microfluidic device 720 according to one or more embodiments. In FIG. 11, the body 902 of microfluidic device 720 can be circular, have an arc, and/or be rectangular. Regardless of the shape of the body 902, inlet port 402 and outlet port 404 are positioned to accommodate and fit over a circular or ring shape such as clearance ring 704 illustrated in FIG. 7. Accordingly, the flow of etchant from inlet port 402 to outlet port 404 flows in a circular channel. In FIG. 11, fins/posts 502, 504 are positioned at opposite ends behind an edge portion of the body 902 of microfluidic device 720. The defect (not shown) is in the channel and fins/posts 502, 504 are respectively behind inlet port 402 and outlet port 404 in a circular configuration. Fins/posts 502, 504 block the flow of etchant from traveling beyond the circular channel so as not to affect other parts of the circuit without the defect.

FIG. 12 is a block diagram of an example microfluidic device 1220 according to one or more embodiments. Microfluidic device 1220 includes microdispense head 810 and alignment outlet fins/posts 802 and 804. Outlet fins/posts 802 and 804 can include holes/drains 1250 which are used to extract and/or vacuum the fluid of etchant that has been dispensed from microdispense head 810. Outlet fins/posts 802 and 804 can be coupled to one or more pumps to extract the etchant. Microdispense head 810 can be positioned in body 902 or integrated in body 902.

Figure 13:
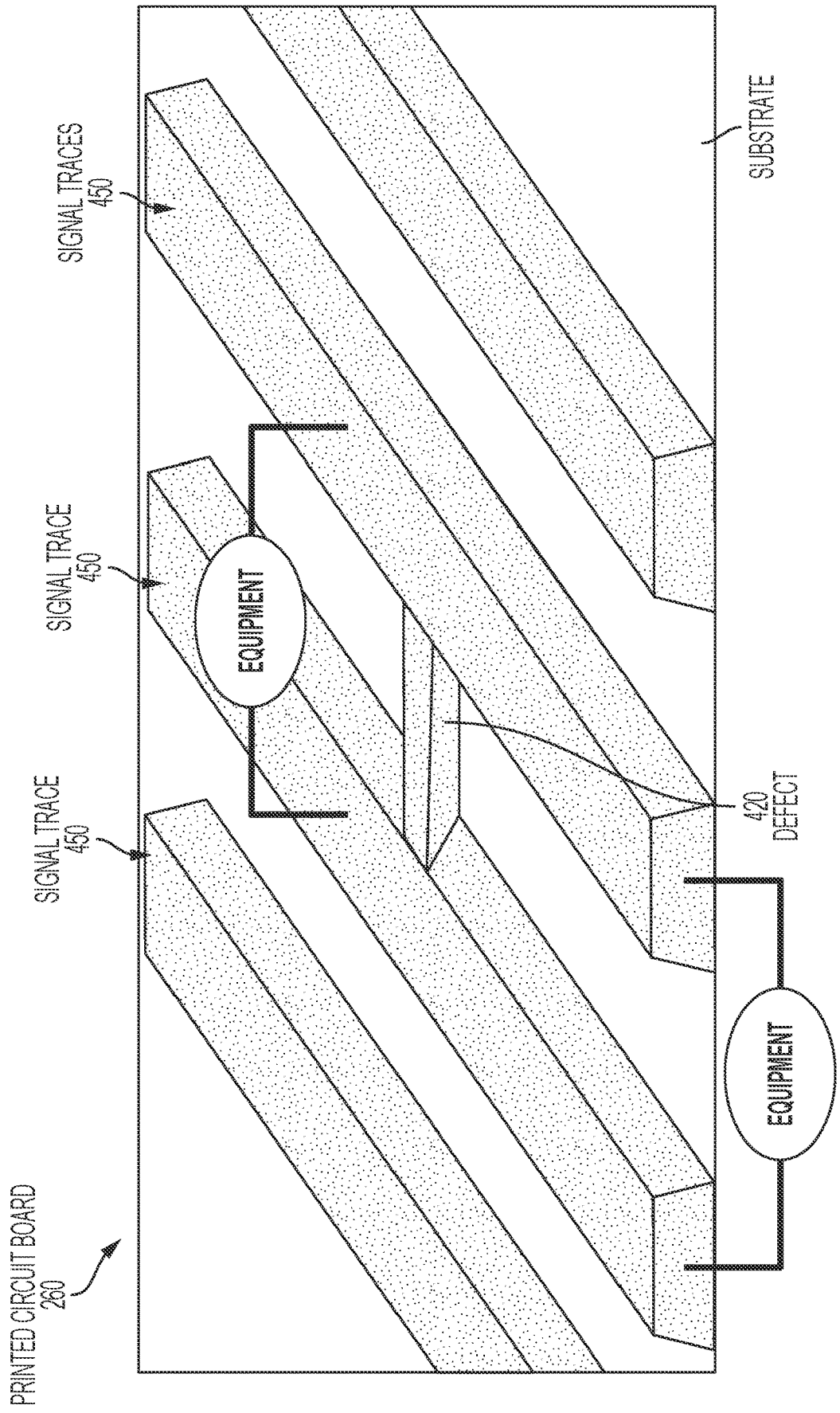
FIG. 13 depicts a block diagram of a circuit with enhanced features for etching using a microfluidic device in accordance with one or more embodiments of the present invention.

FIG. 13 is a block diagram illustrating microfluidic flow with enhanced effect etching rate using electrical current according to one or more embodiments. Microfluidic device 220, 720, 1220 is not shown for the sake of clarity but it is understood that microfluidic device 220, 720, 1220 is present. One or more pieces of equipment can be connected to signal traces in order to generate power for electrical current. Two pieces of equipment are shown for illustration purposes, but it should be appreciated that fewer or more pieces of equipment may be connected to the circuit. The size of the defect is small compared to the size of the signal traces of the circuit. Accordingly, the small defect will heat, and a warm short will be preferentially etched compared to the cool signal traces. The equipment may include power supplies, voltmeters, ohm meters, signal generators, etc., and any other suitable electronic equipment. In one or more embodiments, software application 204 can communicate with, instruct, and control the equipment, and software application 204 can control when to apply power (e.g., voltage to the signal traces) in order to generate electrical current through the defect, while etching is occurring.

The equipment can be used for various enhancements with microfluidic devices 220, 720, 1220, and FIG. 13 illustrates techniques for microfluidic flow feedback. Additionally, FIG. 13 can be utilized to illustrate microfluidic flow feedback with resistance measured to monitor conductivity. In this case, software application 204 and/or an operator can use the equipment to measure resistance between two signal traces connected by the defect, as microfluidic device 220, 720, 1220 is etching the defect. An increase in resistance indicates that the defect is being removed. Use of the resistance measurement can help software application 204 over etch the defect thereby ensuring that the defect is removed. Upon the resistance reaching a predetermined value and/or increasing by a predetermined amount, software application 204 can stop the etching by microfluidic device 220, 720, 1220 and cause microfluidic device 220, 720, 1220 to be removed from the circuit. The heating of the defect occurs while the short exists and relies on a ratio of copper between short and signal trace. Moreover, a pulse process of current and/or voltage can be used to heat the short and accelerate the etching of the short versus the traces. The software application 204 is configured to cause current to heat the short, pump etchant, remove etchant, and repeat until the short (i.e., defect) is removed, even as resistance is monitored. Although resistance is illustrated as an example, it should be appreciated that capacitance could be used as the monitored measurement.

Also, probes from equipment can be connected to signal traces to monitor conductivity between lines (i.e., signal traces), and software application 204 can use this connection as a feedback loop for control and quality. Software application 204 can use conductivity to predict how much etchant time and etchant flow volume are needed. The higher the conductance (G) the more etchant time and/or etchant flow volume is required to remove the defect, as determined by software application 204. Using the change in conductance value and/or change in resistance value (compared to before etching and various points in time during etching), software application 204 is configured to monitor the progress of etching and/or predict when etching is complete using microfluidic device 220, 720, 1220. Additionally, one or more embodiments may use a laser profilometer and/or z-axis focus on AOI system 260 to obtain a three-dimensional (3D) topography of the existing defect.

Figure 14:
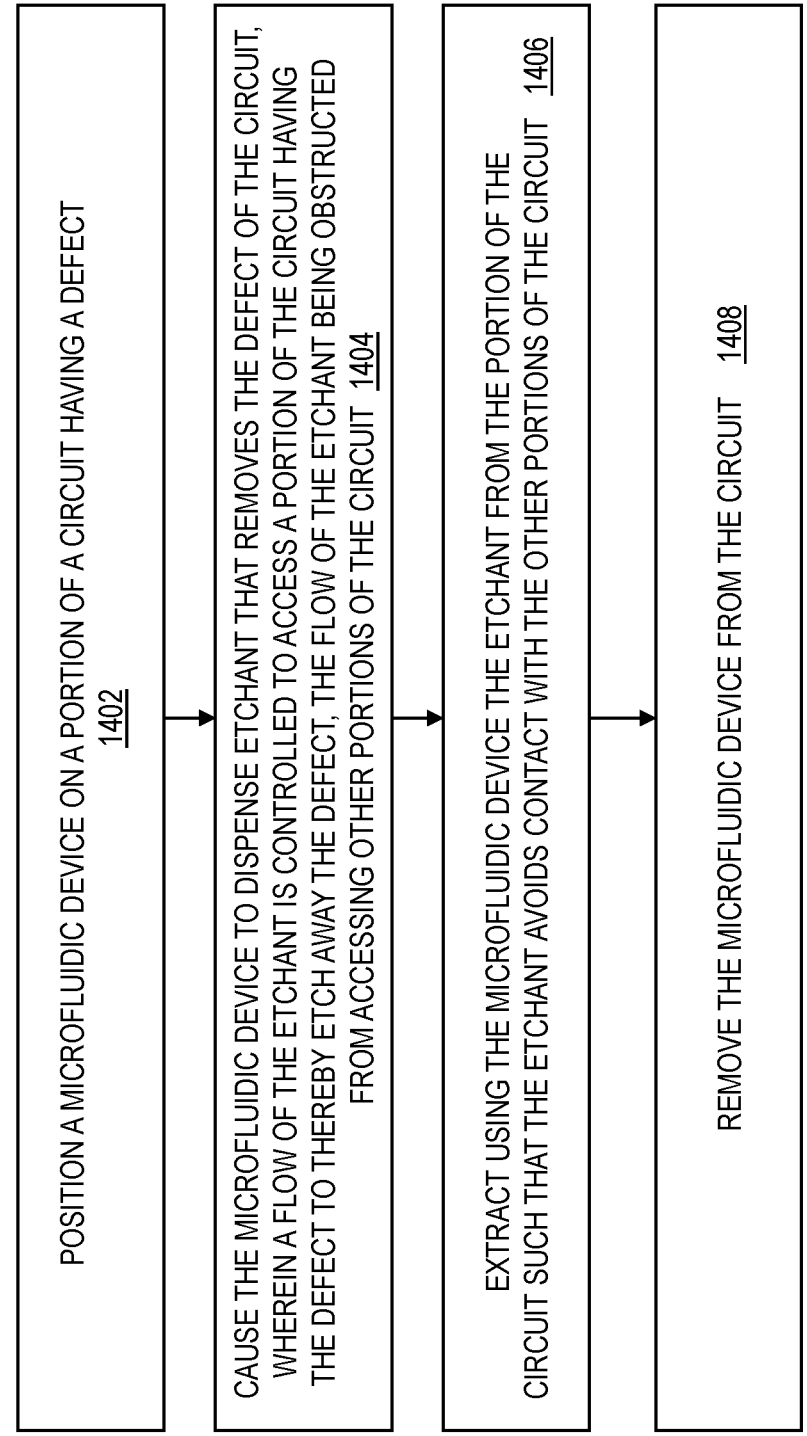
FIG. 14 is a flowchart of a computer-implemented process for short and/or near short etch rework for defects on a printed circuit board in accordance with one or more embodiments of the present invention.

FIG. 14 is a flowchart of a computer-implemented process 1400 for short and/or near short etch rework for defects on a printed circuit board 260 in accordance with one or more embodiments. Reference can be made to any of the figures discussed herein. At block 1402, software application 204 is configured to cause and/or instruct placement machine 270 to position a microfluidic flow device (e.g., microfluidic device 220, 720, 1220) on a portion of a circuit on having a defect on a printed circuit board 260. At block 1404, software application 204 is configured to cause and/or instruct the microfluidic device (e.g., microfluidic device 220, 720, 1202) to dispense etchant that removes the defect of the circuit, where a flow of the etchant is controlled to access a portion of the circuit having the defect to thereby etch away the defect, the flow of the etchant being obstructed from accessing other portions of the circuit. At block 1406, software application 204 is configured to cause and/or instruct the microfluidic device (e.g., microfluidic device 220, 720, 1202) to extract the etchant from the portion of the circuit such that the etchant avoids contact with the other portions of the circuit. At block 1408, software application 204 is configured to cause and/or instruct placement machine 270 to remove the microfluidic device (e.g., microfluidic device 220, 720, 1202) from the circuit.

In one or more embodiments, the microfluidic device includes at least one inlet port (e.g., inlet port 402) and at least one outlet port (e.g., outlet port 404). At least one inlet port of the microfluidic device (e.g., microfluidic device 220, 720) is configured to dispense the etchant and at least one outlet port of the microfluidic device is configured to extract the etchant. A volume of the etchant is based on a type of the defect such as partial height defect versus full height defect (which requires more etchant that a partial height defect). The microfluidic device (e.g., microfluidic device 220, 720) has one or more dimensions that position at least one inlet port (e.g., inlet port 402) and at least one outlet port (e.g., outlet port 404) over/in a space between traces (e.g., copper signal traces) associated with the portion of the circuit having the defect. A bottom surface of the microfluidic device (e.g., microfluidic device 220, 720, 1202) is positioned on at least one or more traces associated with the portion of the circuit having the defect, and the microfluidic device is configured to correspond to a geometry of the defect. The defect could be in a clearance ring and could be partial height or full height.

The microfluidic device (e.g., microfluidic device 220, 720, 1202) includes one or more fins (e.g., fins/posts 502, 504 and fins/posts 802, 802) configured to align the microfluidic device to the portion of the circuit, the one or more fins including a dimension permitting the one or more fins to substantially obstruct a space between traces associated with the portion of the circuit having the defect. The microfluidic device (e.g., microfluidic device 220, 720, 1202) includes one or more fins (e.g., fins/posts 502, 504 and fins/posts 802, 802) configured to align the microfluidic device to the portion of the circuit, the one or more fins having a dimension that substantially coincides with a space between traces associated with the portion of the circuit having the defect.

Figure 15:
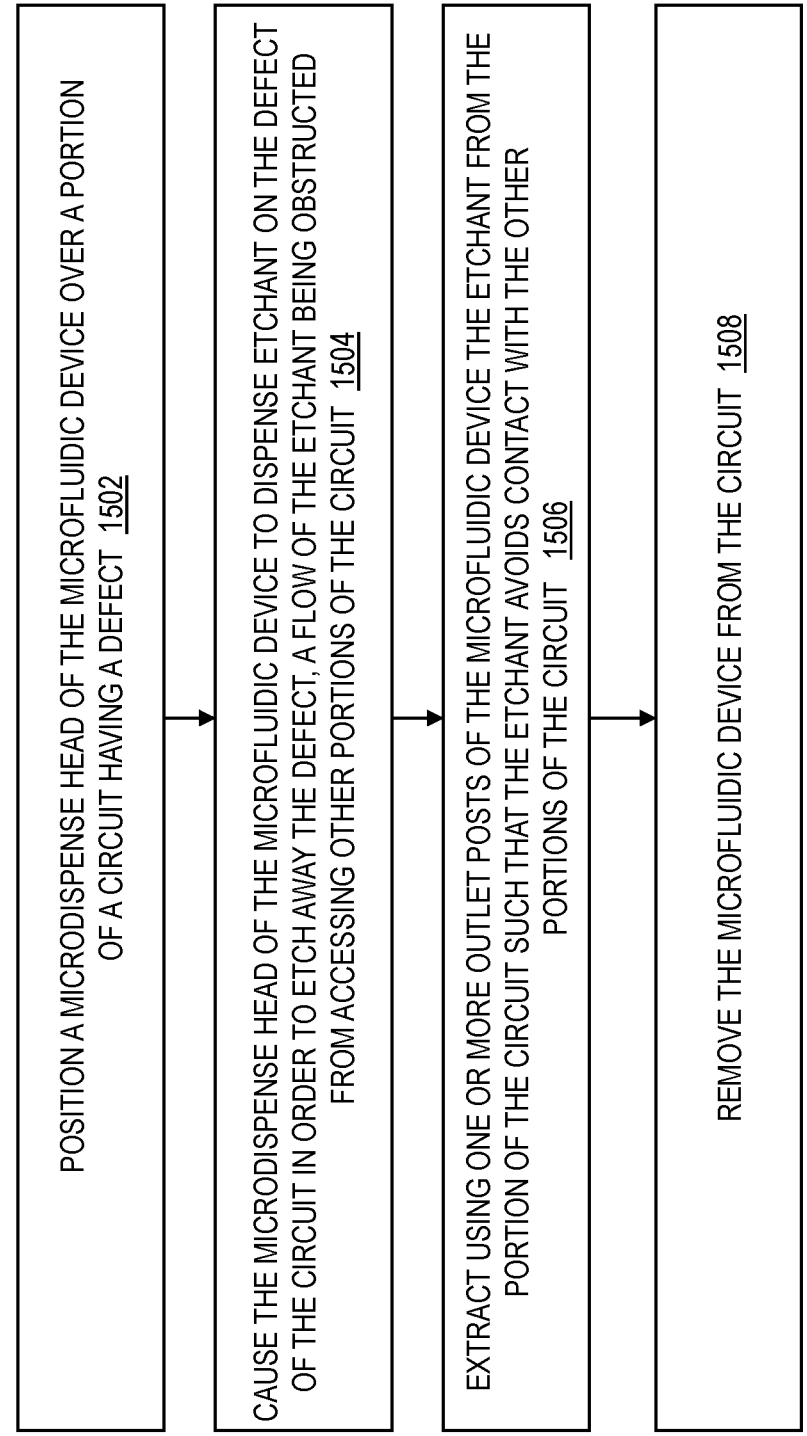
FIG. 15 is a flowchart of a computer-implemented process for short and/or near short etch rework for defects on a printed circuit board in accordance with one or more embodiments of the present invention.

FIG. 15 is a flowchart of a computer-implemented method 1500 for short and/or near short etch rework for defects on a printed circuit board 260 in accordance with one or more embodiments. Reference can be made to any of the figures discussed herein. At block 1502, software application 204 is configured to cause and/or instruct placement machine 270 to position a microdispense head (e.g., microdispense head 810) of the microfluidic device (e.g., microfluidic device 1220) over a portion of a circuit having a defect. At block 1504, software application 204 is configured to cause and/or instruct the microdispense head of the microfluidic device (e.g., microfluidic device 1220) to dispense etchant on the defect of the circuit in order to etch away the defect, a flow of the etchant being obstructed from accessing other portions of the circuit. At block 1506, software application 204 is configured to cause and/or instruct the microfluidic device (e.g., microfluidic device 1220) to extract using one or more outlet posts (e.g., outlet fins/posts 802, 804) the etchant from the portion of the circuit such that the etchant avoids contact with the other portions of the circuit. At block 1508, software application 204 is configured to cause and/or instruct placement machine 270 to remove the microfluidic device (e.g., microfluidic device 1220) from the circuit.

In one or more embodiments, the microdispense head (e.g., microdispense head 810) includes one or more thermal dispensers to dispense the etchant via one or more nozzles. The microdispense head includes one or more piezoelectric dispensers to dispense the etchant via one or more nozzles. The one or more outlet posts (e.g., outlet fins/posts 802, 804) include one or more holes (e.g., holes/drains 1250) positioned to extract a flow of the etchant. The one or more outlet posts include a first outlet post (e.g., fin/post 802) and a second outlet post (e.g., fin/post 804) on opposite sides of the microdispense head (e.g., microdispense head 810). The one or more outlet posts (e.g., outlet fins/posts 802, 804) have a dimension permitting the one or more outlet posts to substantially obstruct a space between traces associated with the portion of the circuit having the defect. The one or more outlet posts (e.g., outlet fins/posts 802, 804) have a dimension that substantially coincides with a space between traces associated with the portion of the circuit having the defect.

In one or more embodiments, methods and techniques are further described using resist to control etching fluid which may employ the microdispense techniques discussed herein to fix electrical (shorts) and non-electrical failures. One or more embodiments can dispense resist in an area surrounding defect locations while defect locations are free of resist. One or more embodiments can dispense resist in over a whole panel except defect locations. For verification, an additional feedback loop may be included along with a camera.

Figure 16:
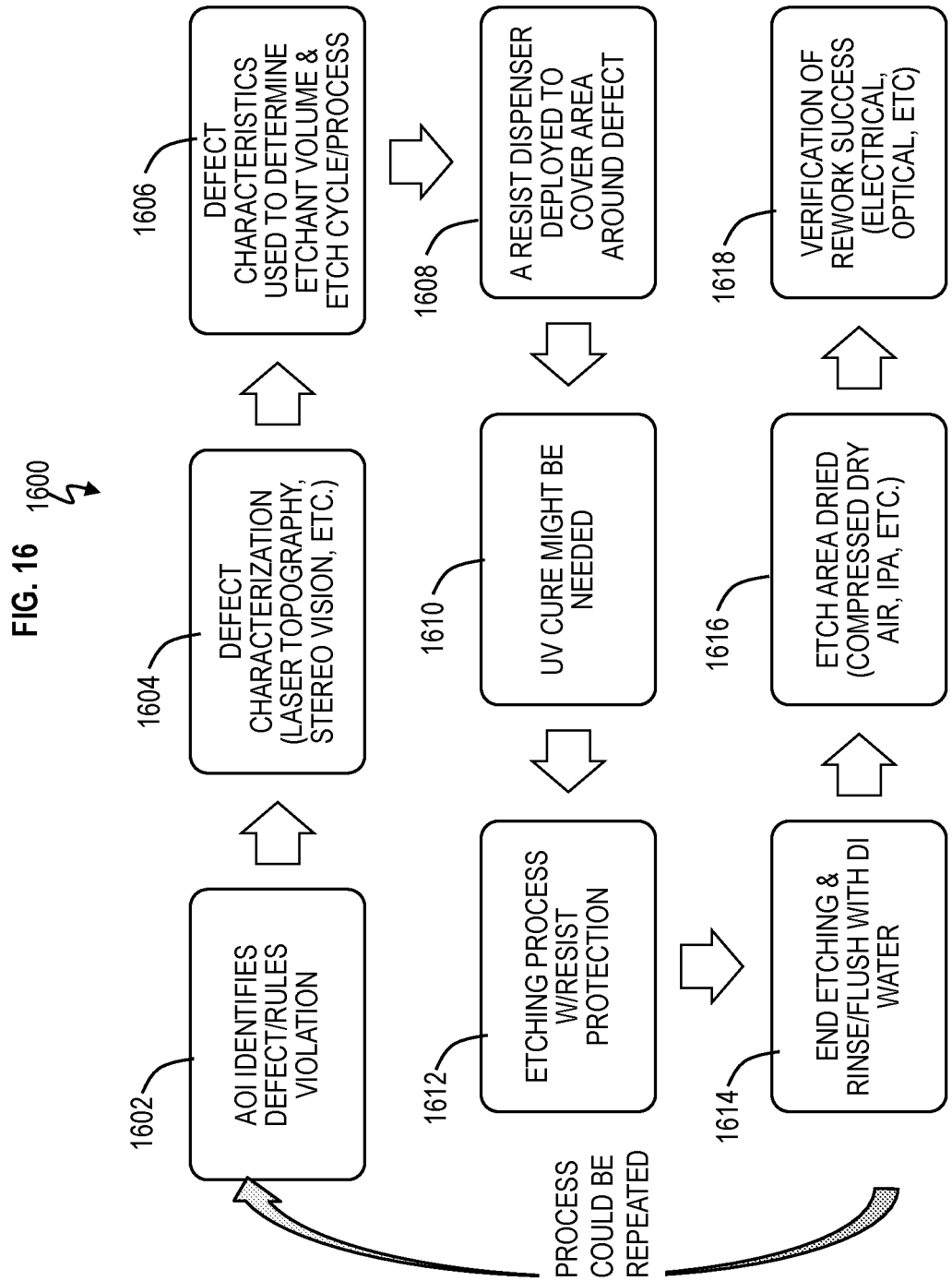
FIG. 16 depicts a process for short and/or near short etch rework for defects on a printed circuit board in accordance with one or more embodiments of the present invention.

FIG. 16 is a flowchart of a computer-implemented method 1600 of short and/or near short etch rework for defects on a printed circuit board in accordance with one or more embodiments. Reference can be made to any figures discussed herein. Computer-implemented method 1600 can be executed by system 200 and/or using standard semiconductor equipment. At block 1602, AOI system 250 is configured to identify a defect and/or rules violation by the circuit on printed circuit board 260. By way of example, AOI system 250 may optically scan and/or capture images of the circuit on printed circuit board 260. AOI system 250 compares the captured images of the circuit on printed circuit board 260 with circuit design 258 of the circuit to determine if any design rules have been violated. At block 1604, AOI system 250 is configured to perform defect characterization of the defect identified on printed circuit board 260. Defect characterization can be performed using laser topography, stereo vision, etc.

At block 1606, AOI system 250 and/or software application 204 is configured to receive the defect characterization information of the defect and then use the defect characteristics to determine etchant volume and etch cycle/process. AOI system 250 and/or software application 204 can use parameters 280 of components for the circuit design 258 to determine an amount of etchant that needs to be applied to remove (i.e., rework) the defect based on the defect characterization information (i.e., characteristics) along with the amount of resist to be applied for protecting other areas of the circuit near the defect. For example, the defect characterization information may indicate the length and height of the excess conductive material causing the short circuit and/or near short circuit. Defect characterization may indicate other areas (that are not the defect itself) of the circuit which are to be protected with resist and that are near the defect. Also, defect characterization information may indicate whether the excess conductive material is a full height defect or partial height defect. A full height defect refers to the excess conductive material being the same or nearly the same height of copper traces in the circuit on printed circuit board 260. A partial height defect refers to the excess conductive material being less that the height of coper traces of the circuit on printed circuit board 260. Software application 204 may access a table of conditions 282 in which the table of conditions 282 includes instructions on the volume of etchant to be applied by microfluidic device 220 to remove each type of short, for example, a full height defect and partial height defect as well as the amount of resist to be applied to other areas of the circuit not containing the defect. Table of conditions 282 may also instruct on the type of cycle/process to be applied using microfluidic device 220.

Figure 17:
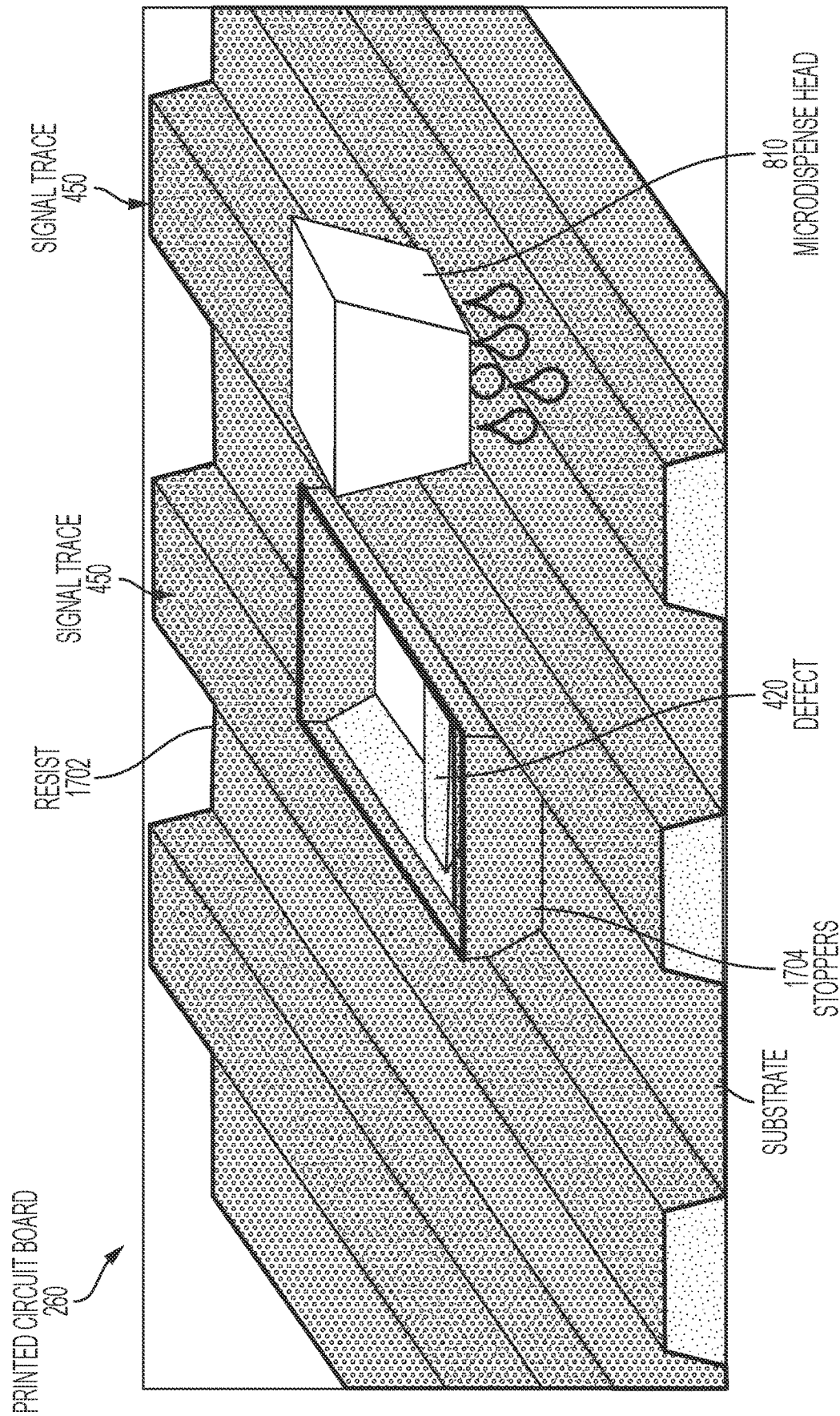
FIG. 17 depicts a block diagram of a microdispense head dispensing resist in an area surrounding defect location(s) in accordance with one or more embodiments of the present invention.

At block 1608, a resist dispenser is deployed to cover area around defect, but not the defect itself with resist. In one or more embodiments, software application 204 can cause and/or instruct microdispense head 810 of microfluidic device 1220 to cover the area surrounding the defect(s) with an un-etchable in, for example, liquid photoresist. Microdispense head 810 of microfluidic device 1220 can be coupled to one or more fluid chamber/reservoirs that contain liquid photoresist for dispersal on the area surrounding the defect(s). For example, FIG. 17 is a block diagram of microdispense head 810 dispensing resist 1702 (e.g., liquid photoresist) in an area surrounding defect location(s) in accordance with one or more embodiments. As discussed herein, a defect 420 is shown between to signal traces. The signal traces can be copper material that connects to other parts of the circuit as designed, while defect 420 is excess copper material that has landed or been deposited on printed circuit board 260 at a location in violation of the circuit design and/or design rules as noted herein. In one or more embodiments, stoppers or dam 1704 can be utilized as an option to stop application of resist 1702. Stoppers/dam 1704 can be a rubber material, teflon, plastic, etc., or combinations thereof. In one or more embodiments, software application 204 can cause placement machine 270 to place the stoppers/dam 1704 around or partially around defect 420. In some cases, stoppers/dam 1704 may not be used. In one or more embodiments, the same microdispense head 810 can be used to dispense photoresist and etchant but with different nozzles for photoresist and etchant which can be contained in separate fluid chambers/reservoirs. In one or more embodiments, a separate microdispense head 810 could be used for dispensing etchant and photoresist.

At block 1610, ultraviolet light (UV) may be used to cure the resist. In one or more embodiments, software application 204 may cause and/or instruct placement machine 270 to select a UV device to apply the UV light to cure the liquid photoresist.

Figure 18:
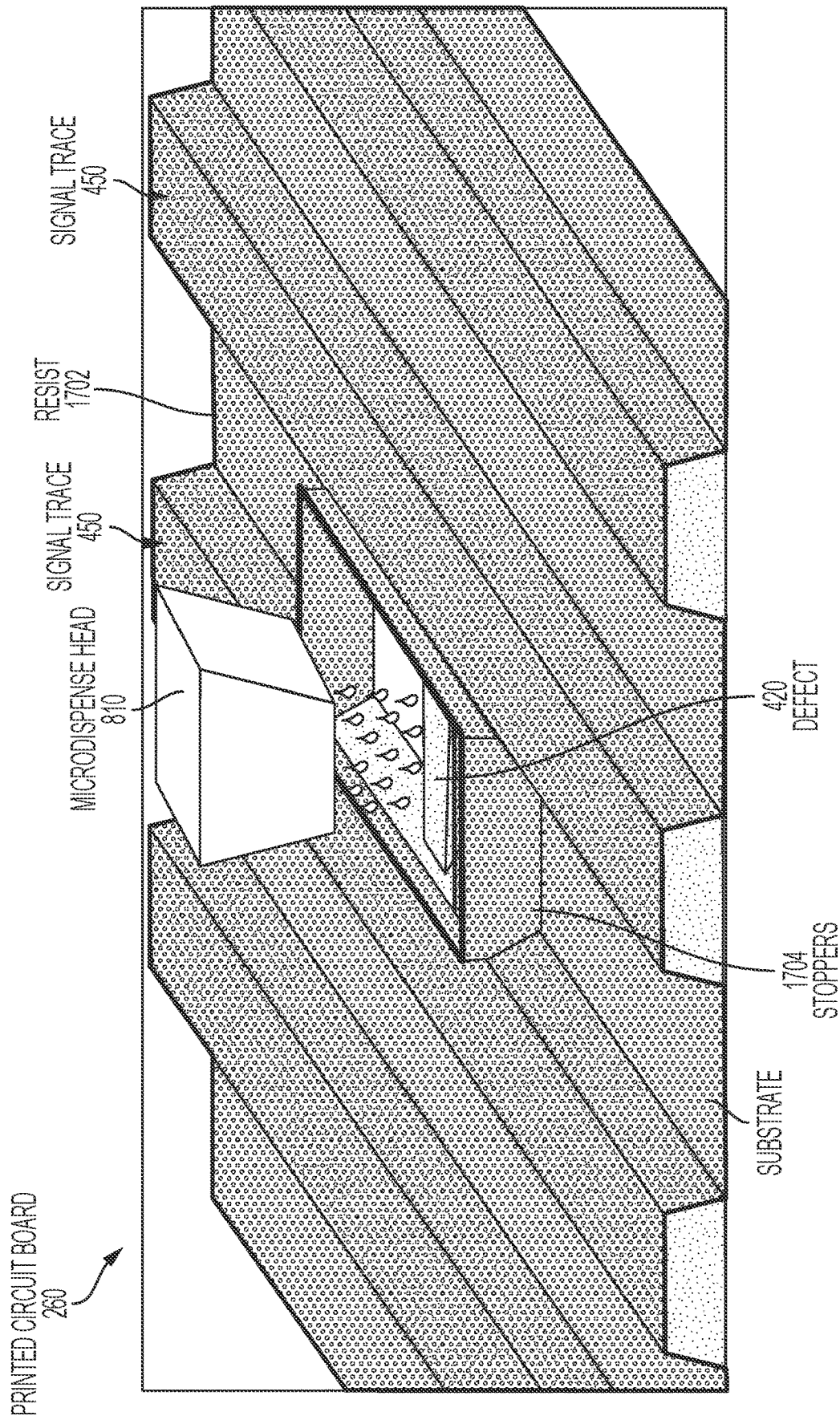
FIG. 18 depicts a block diagram of a microdispense head dispensing etchant onto one or more defects in accordance with one or more embodiments of the present invention.

At block 1612, software application 204 causes/instructs microfluidic device 1220 to dispense etchant to remove the defect, which is a short or near short circuit caused by excess conductive material. Resist 1702 protects other parts of the circuit while the defect is etched away (i.e., removed). The etchant is contained in a separate reservoir or fluid chamber from the liquid photoresist, for access by microfluidic device 1220. FIG. 18 is a block diagram of microdispense head 810 dispensing etchant to one or more defects 420 in accordance with one or more embodiments. This controlled flow of etchant continues and etches away defect 420, while other areas of the circuit of printed circuit board 260 are protected by resist 1702.

At block 1614, software application 204 causes/instructs microfluidic device 1220 to end etching and perform rinse/flushing. The rinse/flushing can be performed using, for example, deionizing water. For example, instead of etchant flowing microdispense head 810, the rinse/flushing solution is flowed, thereby removing any debris (e.g., pieces of copper material) of the defect that may have remained after etching. In one or more embodiments, microfluidic device 1220 can be removed, and the rinsing/flushing of the etched area the circuit on printed circuit board 260 is performed by another suitable method. In one or more embodiments, microfluidic device 1220 remains, and the rinsing/flushing solution can be applied via microdispense head 810. The rinsing/flushing solution (e.g., deionized water, etc.) can be contained in a fluid chamber or reservoir coupled to microfluidic device 1220.

At block 1616, software application 204 causes the etched area of the circuit to be dried. The previously etched area can be dried using compressed dry air, isopropyl alcohol (IPA), etc. In one or more embodiments, microfluidic device 1220 can be removed when applying the comprised dry air, IPA, etc. At block 1618, software application 204 can cause verification of rework success. Verification of rework success can be performed by electrical inspection, optical inspection, etc.

Figure 19:
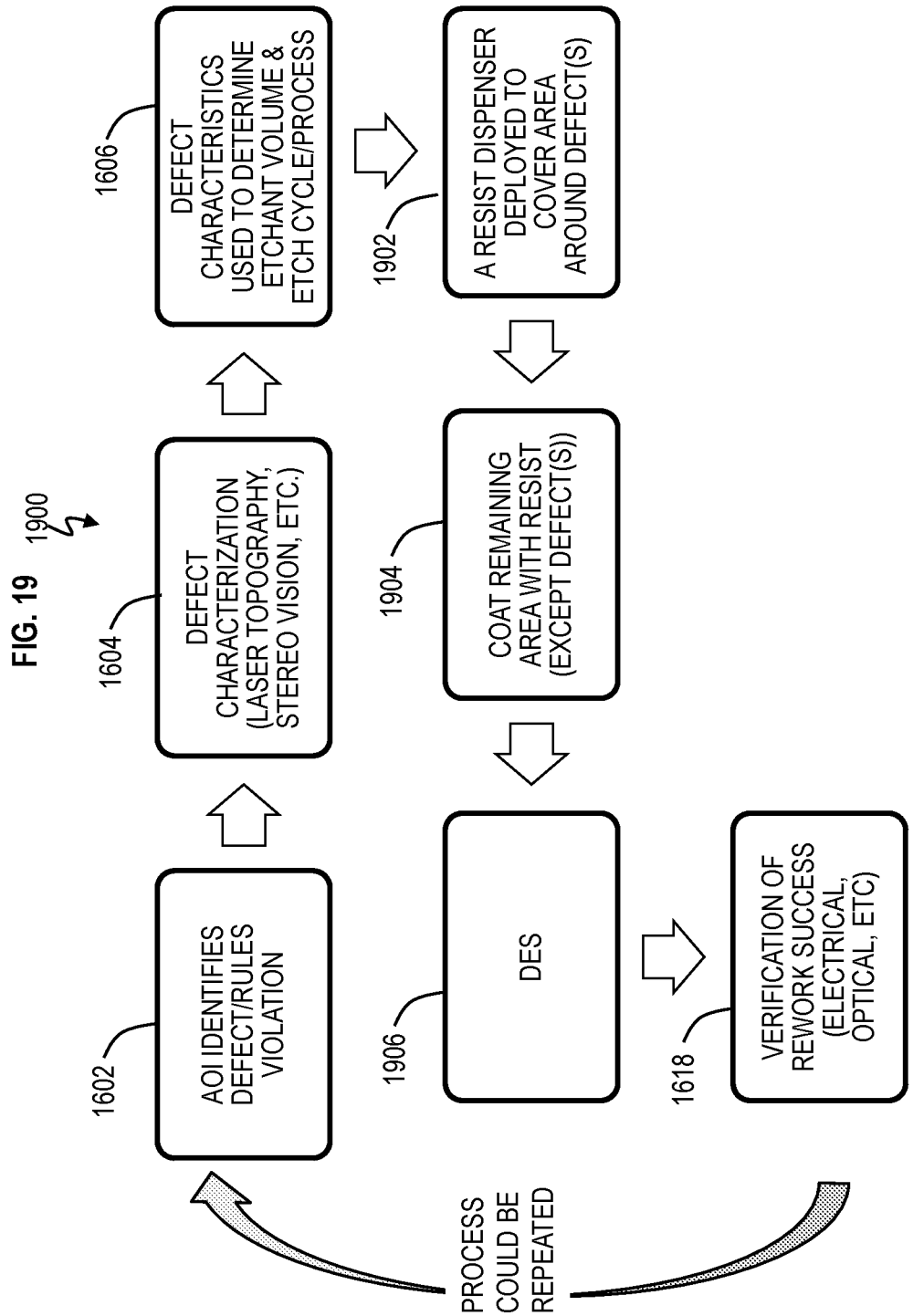
FIG. 19 depicts a process for short and/or near short etch rework for defects on a printed circuit board in accordance with one or more embodiments of the present invention.

FIG. 19 is a flowchart of a computer-implemented method 1900 of short and/or near short etch rework for defects on a printed circuit board in accordance with one or more embodiments. Reference can be made to any figures discussed herein. Computer-implemented method 1900 can be executed using system 200 and/or using standard semiconductor equipment. Computer-implemented method 1900 may use and/or incorporate elements from computer-implemented method 1600. Blocks 1602, 1604, and 1606 are similar to FIG. 16 and their descriptions are not repeated.

Figure 20:
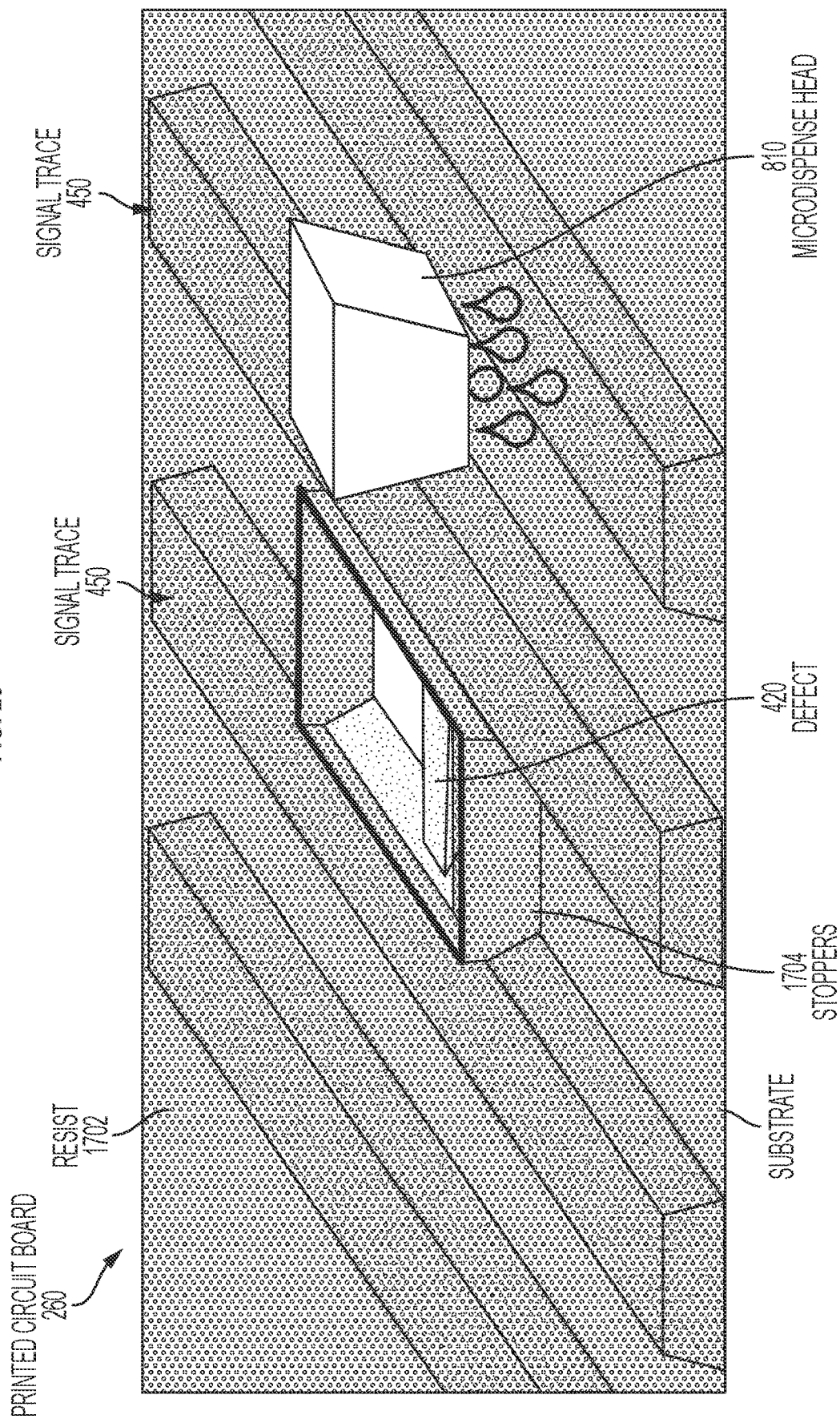
FIG. 20 depicts a block diagram of a microdispense head dispensing resist on whole panel and/or printed circuit board except defect location(s) in accordance with one or more embodiments of the present invention.

At block 1902, a resist dispenser is deployed to cover area around defect, but not the defect itself with resist. Unlike FIG. 16, the resist dispenser is caused/instructed to dispense resist on the whole panel except for defect locations. In one or more embodiments, software application 204 can cause and/or instruct microdispense head 810 of microfluidic device 1220 to cover the whole area surrounding the defect(s) with an un-etchable in, for example, liquid photoresist. In one or more embodiments, an immediate area surrounding defect(s) may be covered using microdispense head 810 because of the precise disposition of resist, and a larger area may be covered using a coarse sprayer. As noted herein, microdispense head 810 of microfluidic device 1220 can be coupled to one or more fluid chamber/reservoirs that contain liquid photoresist for dispersal on the area surrounding the defect(s). FIG. 20 is a block diagram of microdispense head 810 dispensing resist 1702 (e.g., liquid photoresist) on the whole panel or printed circuit board 260 except defect location(s) in accordance with one or more embodiments. Only defect 420 between to signal traces is left open (i.e., no resist 1702 is applied to defect 420). Covering the whole printed circuit board 260 with resist 1702 except defect locations makes it is easier to etch multiple defects. FIGS. 16 and 19 could be utilized together to optimize rework of some combinations of defects. As noted herein, stoppers or dam 1704 can be utilized as an option to stop application of resist 1702. UV light may be used to cure the resist.

At block 1904, software application 204 causes/instructs microfluidic device 1220 to dispense resist (e.g., liquid photoresist) in areas close to defect 420 without coating defect 420. For example, the precision of microdispense head 810 is used to coat areas in the immediate vicinity surrounding defect 420.

At block 1906, the printed circuit board 260 put back through developing, etching, and stripping (DES) process. Standard DES equipment can be used but the process may be optimized for defects, for example, speed through DES could be adjusted for defect type. Standard or known DES chemistry may be used. In DES, developing involves using developer to dissolve the photoresist that was not exposed to the UV light. Removing the unpolymerized resist exposes the metal (i.e., the defect) that is to be etched away. Etching involves using an etchant (solution) to remove the metal (i.e., defect) but not removing material protected by the photoresist. Stripping is the process of stripping the photoresist from the metal and/or areas previously protected by photoresist. It should be appreciated that this enables simultaneous etching of multiple (similar) defects and could be used in combination with FIG. 16 to optimize rework for multiple defect types (e.g., half height, full height, and/or combinations thereof).

At block 1618 (e.g., repeated from FIG. 16), software application 204 can cause verification of rework success. Verification of rework success can be performed by electrical inspection, optical inspection, etc.

Figure 21:
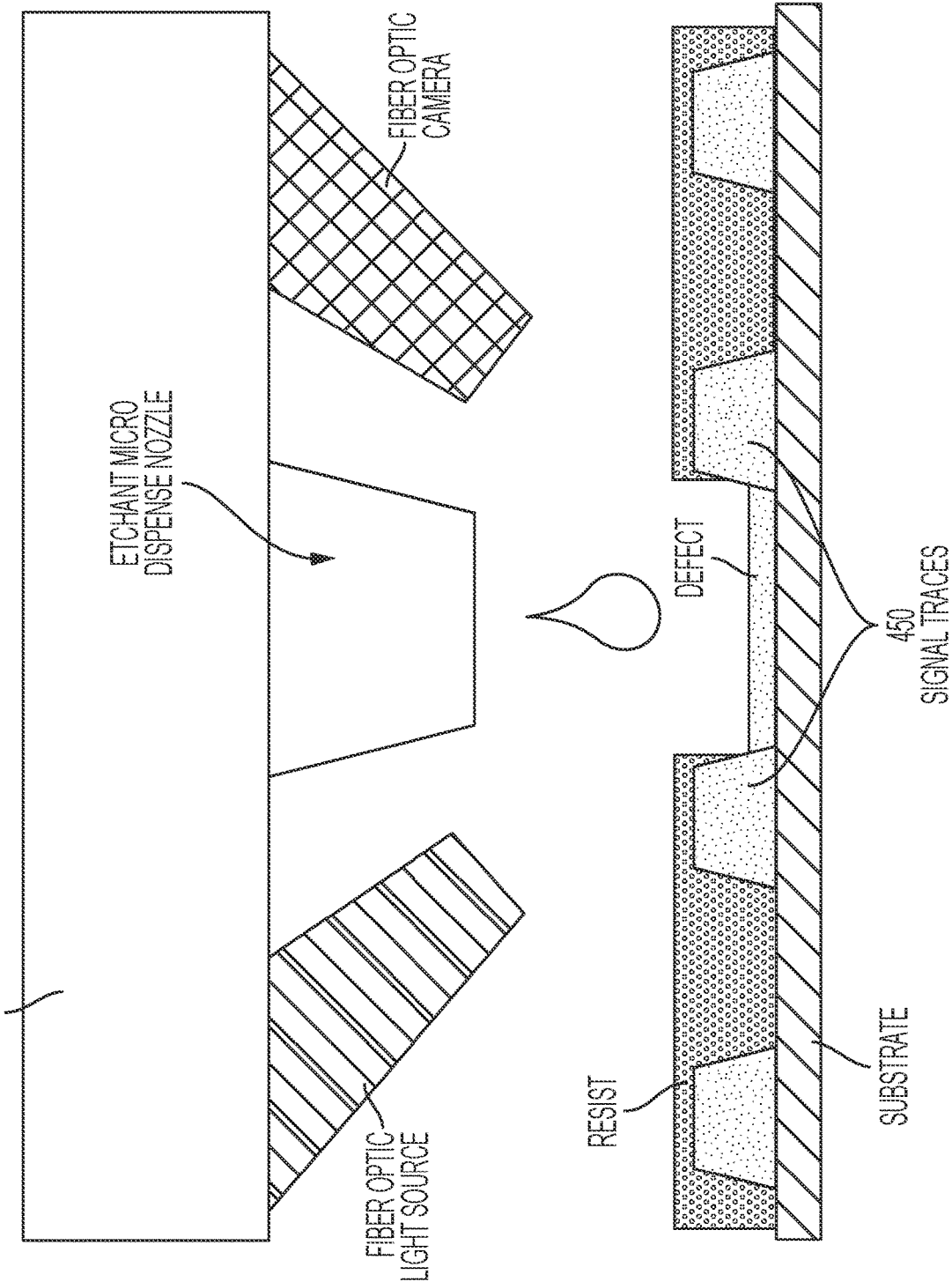
FIG. 21 depicts a block diagram illustrating use of a fiber optic camera to monitor an etching process according to one or more embodiments.

FIG. 21 is a block diagram illustrating use of a fiber optic camera to monitor etching process according to one or more embodiments. A fiber optic light source may be used to irradiate light onto the defect and a fiber optic camera can be used to continuously capture images of the etching process. The fiber optic light source and fiber optic camera may be attached to microfluidic device 1220. In one or more embodiments, fiber optic light source and/or fiber optic camera may be separate from microfluidic device 1220.

Figure 22:
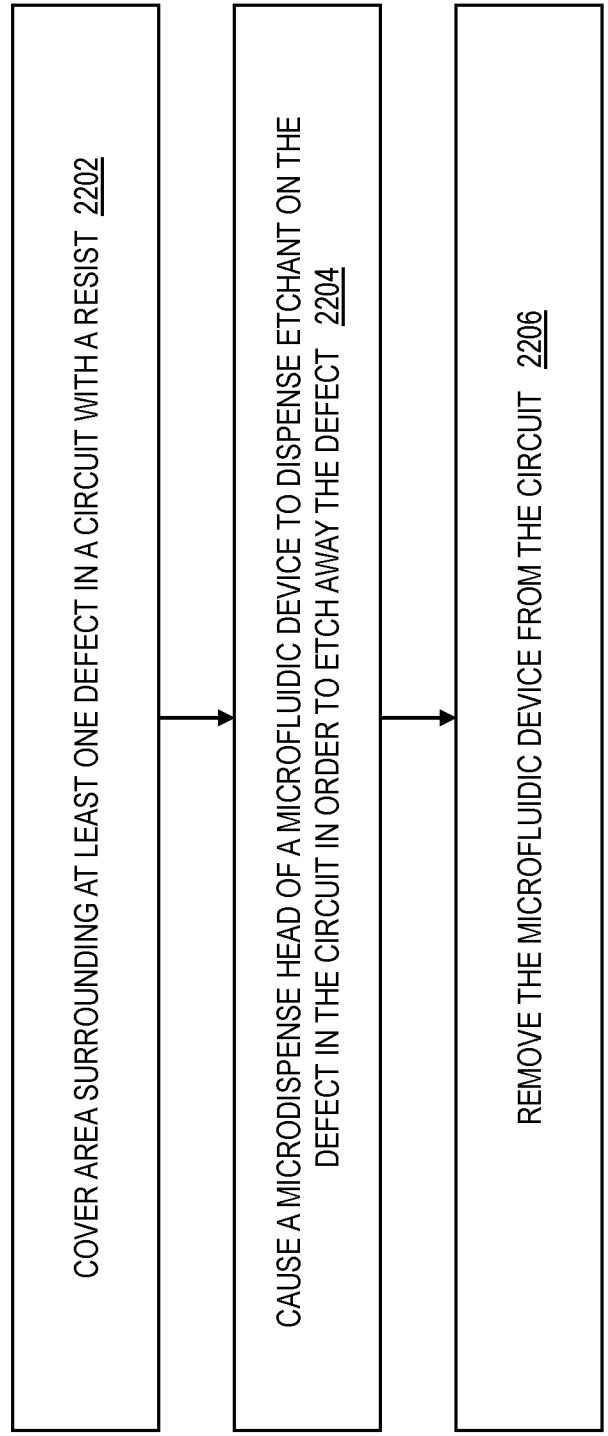
FIG. 22 is a flowchart of a computer-implemented process for short and/or near short etch rework for defects on a printed circuit board in accordance with one or more embodiments of the present invention.

FIG. 22 is a flowchart of a computer-implemented method 2200 of short and/or near short etch rework for defects on a printed circuit board in accordance with one or more embodiments. Reference can be made to any figures discussed herein. Computer-implemented method 2200 can be executed using system 200 and/or using standard semiconductor equipment. At block 2202, software application 204 can cause the covering an area surrounding at least one defect in a circuit with a resist. A resist dispenser and/or microdispense head 810 may be deployed to cover area around defect, but not the defect itself with resist. At block 2204, software application 204 can cause microdispense head 810 of a microfluidic device 1220 to dispense etchant on the defect in the circuit in order to etch away the defect. At block 2206, software application 204 can cause placement machine 270 to removal the microfluidic device 1220 from the circuit.

In one or more embodiments, the resist is removed responsive to etching away the defect. The microdispense head 810 of the microfluidic device is used to dispense the resist to cover the area surrounding the at least one defect in the circuit without covering the at least one defect. The resist is an un-etchable liquid photoresist. The resist is cured using UV light. The area surrounding the at least one defect in the circuit includes an entirety of a top surface of a printed circuit board excluding the at least one defect.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   positioning a microfluidic device on a portion of a circuit having a defect;
   causing the microfluidic device to dispense etchant that removes the defect of the circuit, wherein a flow of the etchant is controlled to access the portion of the circuit having the defect to thereby etch away the defect, the flow of the etchant being obstructed from accessing other portions of the circuit;
   extracting using the microfluidic device the etchant from the portion of the circuit such that the etchant avoids contact with the other portions of the circuit, wherein the portion of the circuit comprises traces with a cavity separating the traces; and
   removing the microfluidic device from the circuit, wherein the microfluidic device comprises one or more fins configured to align the microfluidic device to the portion of the circuit, the one or more fins comprising a dimension that substantially blocks the cavity between the traces associated with the portion of the circuit having the defect.

2. The computer-implemented method of claim 1, wherein the microfluidic device comprises at least one inlet port and at least one outlet port.

3. The computer-implemented method of claim 1, wherein:
   at least one inlet port of the microfluidic device is configured to dispense the etchant and at least one outlet port of the microfluidic device is configured to extract the etchant; and
   a volume of the etchant is based on a type of the defect.

4. The computer-implemented method of claim 1, wherein the microfluidic device comprises one or more dimensions that position at least one inlet port and at least one outlet port over a space between the traces associated with the portion of the circuit having the defect.

5. The computer-implemented method of claim 1, wherein:
   a bottom surface of the microfluidic device is positioned on the traces associated with the portion of the circuit having the defect; and
   the microfluidic device is configured to correspond to a geometry of the defect.

6. The computer-implemented method of claim 1, wherein the microfluidic device comprises the one or more fins configured to align the microfluidic device to the portion of the circuit, the one or more fins comprising a dimension permitting the one or more fins to substantially obstruct a space between the traces associated with the portion of the circuit having the defect.

7. A computer-implemented method comprising:
   positioning a microdispense head of a microfluidic device over a portion of a circuit having a defect;
   causing the microdispense head of the microfluidic device to dispense etchant on the defect of the circuit in order to etch away the defect, a flow of the etchant being obstructed from accessing other portions of the circuit;
   extracting using one or more outlet posts of the microfluidic device the etchant from the portion of the circuit such that the etchant avoids contact with the other portions of the circuit, wherein the portion of the circuit comprises traces with a cavity separating the traces; and
   removing the microfluidic device from the circuit, wherein the one or more outlet posts comprise a dimension permitting the one or more outlet posts to substantially block the cavity between the traces associated with the portion of the circuit having the defect.

8. The computer-implemented method of claim 7, wherein the microdispense head comprises one or more thermal dispensers to dispense the etchant.

9. The computer-implemented method of claim 7, wherein the microdispense head comprises one or more piezoelectric dispensers to dispense the etchant.

10. The computer-implemented method of claim 7, wherein the one or more outlet posts comprise one or more holes positioned to extract the flow of the etchant.

11. The computer-implemented method of claim 7, wherein the one or more outlet posts comprise a first outlet post and a second outlet post on opposite sides of the microdispense head.

12. The computer-implemented method of claim 7, wherein the one or more outlet posts comprise a dimension that substantially coincides with a space between the traces associated with the portion of the circuit having the defect.

* * * * *